(12) United States Patent
Park et al.

(10) Patent No.: US 10,868,096 B2
(45) Date of Patent: Dec. 15, 2020

(54) DISPLAY DEVICE

(71) Applicant: Samsung Display Co., Ltd., Yongin-Si (KR)

(72) Inventors: Juchan Park, Yongin-si (KR); Sunho Kim, Yongin-si (KR); Sunhee Lee, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/287,983

(22) Filed: Feb. 27, 2019

(65) Prior Publication Data

US 2019/0267440 A1 Aug. 29, 2019

(30) Foreign Application Priority Data

Feb. 28, 2018 (KR) .................. 10-2018-0024734

(51) Int. Cl.
*H01L 27/32* (2006.01)
*H01L 51/52* (2006.01)
(Continued)

(52) U.S. Cl.
CPC .......... *H01L 27/3258* (2013.01); *G09F 9/301* (2013.01); *G09G 3/3233* (2013.01); *G09G 3/3266* (2013.01); *G09G 3/3291* (2013.01); *H01L 27/3262* (2013.01); *H01L 27/3265* (2013.01); *H01L 27/3276* (2013.01); *H01L 51/5218* (2013.01); *H01L 51/5234* (2013.01);
(Continued)

(58) Field of Classification Search
CPC ............ H01L 27/3258; H01L 27/3262; H01L 27/3265; H01L 27/3276; H01L 51/5218; H01L 51/5234; H01L 51/5256; H01L 51/0097; H01L 51/5253; H01L 2251/5338; G09F 9/301; G09G 3/3233; G09G 3/3266; G09G 3/3291; G09G 2300/0426; G09G 2300/043
USPC ......................................................... 257/40
See application file for complete search history.

(56) References Cited

U.S. PATENT DOCUMENTS

2006/0078671 A1* 4/2006 Lee .................... H01L 27/1214
427/66
2015/0108484 A1   4/2015 Park et al.
(Continued)

FOREIGN PATENT DOCUMENTS

CN        106783917 A     5/2017
KR   10-2014-0129647 A    11/2014
(Continued)

OTHER PUBLICATIONS

Extended European Search Report, Application No. 19159856.4, dated Jul. 23, 2019, 11 pages.

*Primary Examiner* — Tu-Tu V Ho
(74) *Attorney, Agent, or Firm* — Innovation Counsel LLP

(57) ABSTRACT

A display device includes: a substrate; an inorganic insulating layer arranged in a display region, the inorganic insulating layer having a lower valley as an opening or a groove arranged in a region between a first pixel circuit and a second pixel circuit adjacent to each other; a first organic planarization layer arranged over entire regions of the first pixel circuit and the second pixel circuit, the first organic planarization layer filling the lower valley; and a connection wire arranged on the first organic planarization layer, the connection wire connecting the first pixel circuit to the second pixel circuit.

19 Claims, 19 Drawing Sheets

(51) Int. Cl.
  *G09F 9/30* (2006.01)
  *G09G 3/3233* (2016.01)
  *G09G 3/3266* (2016.01)
  *G09G 3/3291* (2016.01)
  *H01L 51/00* (2006.01)

(52) U.S. Cl.
  CPC ... *H01L 51/5256* (2013.01); *G09G 2300/043* (2013.01); *G09G 2300/0426* (2013.01); *H01L 51/0097* (2013.01); *H01L 51/5253* (2013.01); *H01L 2251/5338* (2013.01)

(56) References Cited

U.S. PATENT DOCUMENTS

| | | |
|---|---|---|
| 2016/0118451 A1 | 4/2016 | Youn et al. |
| 2017/0077447 A1 | 3/2017 | Kang et al. |
| 2018/0047802 A1 | 2/2018 | Yoon et al. |
| 2019/0156708 A1 | 5/2019 | Li et al. |
| 2019/0207150 A1* | 7/2019 | Kwon ................. H01L 51/5206 |

FOREIGN PATENT DOCUMENTS

| | | |
|---|---|---|
| KR | 10-2015-0046963 A | 5/2015 |
| KR | 10-2016-0047132 A | 5/2016 |
| KR | 10-2017-0039537 A | 4/2017 |

\* cited by examiner

DISPLAY DEVICE

CROSS-REFERENCE TO RELATED APPLICATION

This application claims the benefit of Korean Patent Application No. 10-2018-0024734, filed on Feb. 28, 2018, in the Korean Intellectual Property Office, the disclosure of which is incorporated herein in its entirety by reference.

BACKGROUND

1. Field

One or more embodiments relate to a display device.

2. Description of the Related Art

Generally, a display device includes a plurality of display elements and electronic elements for controlling electric signals applied to the display elements. Examples of the electronic elements include thin film transistors (TFTs), storage capacitors, and wires.

To accurately control emission and a degree of emission by a display element, the number of TFTs that are electrically connected to each display element and the number of wires transferring an electric signal to the TFTs may be increased. Accordingly, efforts are actively made to achieve a high degree of integration of display elements and electronic elements in a display device and simultaneously reduce occurrence of defects.

SUMMARY

Embodiments include a display device which is flexible while being resistant to damages caused by an external impact.

However, the embodiments described herein are exemplary, and the scope of the present disclosure is not limited thereto.

Additional aspects will be set forth in part in the description which follows and, in part, will be apparent from the description, or may be learned by practice of the presented embodiments.

According to one or more embodiments, a display device includes: a substrate including a display area and a peripheral area outside the display area, the display area including a plurality of pixel circuits and a plurality of display elements respectively connected to the plurality of pixel circuits to display an image; an inorganic insulating layer arranged in the display area, the inorganic insulating layer having a lower valley as an opening or a groove in a region and arranged between a first pixel circuit and a second pixel circuit that are adjacent to each other; a first organic planarization layer arranged over entire regions of the first pixel circuit and the second pixel circuit, the first organic planarization layer filling the lower valley; and a connection wire arranged on the first organic planarization layer, the connection wire connecting the first pixel circuit to the second pixel circuit, wherein the connection wire is connected to a first conductive layer in the first pixel circuit through a first contact hole passing through the first organic planarization layer and is connected to a second conductive layer in the second pixel circuit through a second contact hole passing through the first organic planarization layer.

The first conductive layer and the second conductive layer may be spaced apart from each other by the lower valley, and the first conductive layer and the second conductive layer may be arranged on an upper surface of the inorganic insulating layer.

The inorganic insulating layer may include a first gate insulating layer and a second gate insulating layer arranged on the first gate insulating layer, wherein the first conductive layer and the second conductive layer may be arranged on the first gate insulating layer and be spaced apart from each other by the lower valley, the second gate insulating layer may cover the first conductive layer and the second conductive layer, and the first contact hole and the second contact hole may pass through the second gate insulating layer.

The lower valley may surround at least some pixel circuits from among the plurality of pixel circuits.

The display device may further include an interlayer insulating layer arranged on the connection wire, the interlayer insulating layer having an upper valley as an opening or a groove arranged in a region between the first pixel circuit and the second pixel circuit.

The display device may further include a second organic planarization layer arranged over the entire regions of the first pixel circuit and the second pixel circuit, the second organic planarization layer filling the upper valley.

The plurality of pixel circuits may include a third pixel circuit adjacent to the second pixel circuit, and the display device may further include: an additional connection wire arranged on a same layer as the connection wire, the additional connection wire connecting the second pixel circuit to the third pixel circuit; and an interlayer insulating layer arranged on the additional connection wire, the interlayer insulating layer having an upper valley in a region between the second pixel circuit and the third pixel circuit.

The additional connection wire may be formed integrally with the connection wire.

Each of the plurality of pixel circuits may include a driving thin film transistor and a storage capacitor, wherein the driving thin film transistor may overlap the storage capacitor.

The display device may further include: a bending organic material layer arranged in a bending area bent around a bending axis extending in the first direction in the peripheral region; and a fan-out wire extending in the second direction and arranged on the bending organic material layer.

According to one or more embodiments, a display device includes a first pixel circuit, a second pixel circuit, and a third pixel circuit, sequentially arranged in a first direction, in a display area for displaying an image, and the display device further includes: an inorganic insulating layer having a first lower valley as an opening or a groove in a first region and arranged between the first pixel circuit and the second pixel circuit; a first organic planarization layer arranged over entire regions of the first pixel circuit, the second pixel circuit, and the third pixel circuit, the first organic planarization layer filling the first lower valley; a first connection wire arranged on the first organic planarization layer, the first connection wire overlapping the first region and connecting the first pixel circuit and the second pixel circuit; a second connection wire arranged on the first organic planarization layer, the second connection wire connecting the second pixel circuit and the third pixel circuit; an interlayer insulating layer arranged on the first connection wire and the second connection wire, the interlayer insulating layer having a second upper valley as an opening or a groove and arranged in a second region between the second pixel circuit and the third pixel circuit; and a second organic planarization layer arranged over the entire regions of the first pixel circuit, the second pixel circuit, and the third pixel circuit, the second organic planarization layer filling the second upper valley.

The interlayer insulating layer may further have a first upper valley as an opening or a groove that is arranged in the first region.

The inorganic insulating layer may further have a second lower valley as an opening or a groove that is arranged in the second region.

The display device may further include a vertical connection wire arranged on the interlayer insulating layer and extending in a second direction crossing the first direction.

The vertical connection wire may include a driving voltage line and a data line.

The inorganic insulating layer may include a first gate insulating layer and a second gate insulating layer arranged on the first gate insulating layer, and the display device may further include: a first conductive layer arranged on the first gate insulating layer in the first pixel circuit; and a second conductive layer arranged on the first gate insulating layer in the second pixel circuit, wherein the first conductive layer and the second conductive layer may be spaced apart from each other with the first lower valley therebetween, and the first connection wire may be connected to the first conductive layer and the second conductive layer respectively through a first contact hole and a second contact hole passing through the first organic planarization layer and the second gate insulating layer.

At least one of the first lower valley and the second upper valley may surround at least some of the first to third pixel circuits.

Each of the first pixel circuit and the second pixel circuit may include a driving thin film transistor and a storage capacitor that may overlap each other, wherein an upper electrode of the storage capacitor of the first pixel circuit and an upper electrode of the storage capacitor of the second pixel circuit may be connected by a mesh connection line that is one of the first connection wire.

Each of the first pixel circuit, the second pixel circuit, and the third pixel circuit may include: an organic light-emitting element including a pixel electrode, an opposite electrode facing the pixel electrode, and an intermediate layer including an organic light-emitting layer arranged between the pixel electrode and the opposite electrode; and an encapsulation layer covering the organic light-emitting element, wherein the encapsulation layer may include a first inorganic encapsulation layer, a second inorganic encapsulation layer, and an organic encapsulation layer arranged between the first inorganic encapsulation layer and the second inorganic encapsulation layer.

At least a portion of the display area of the display device may be folded or rolled.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
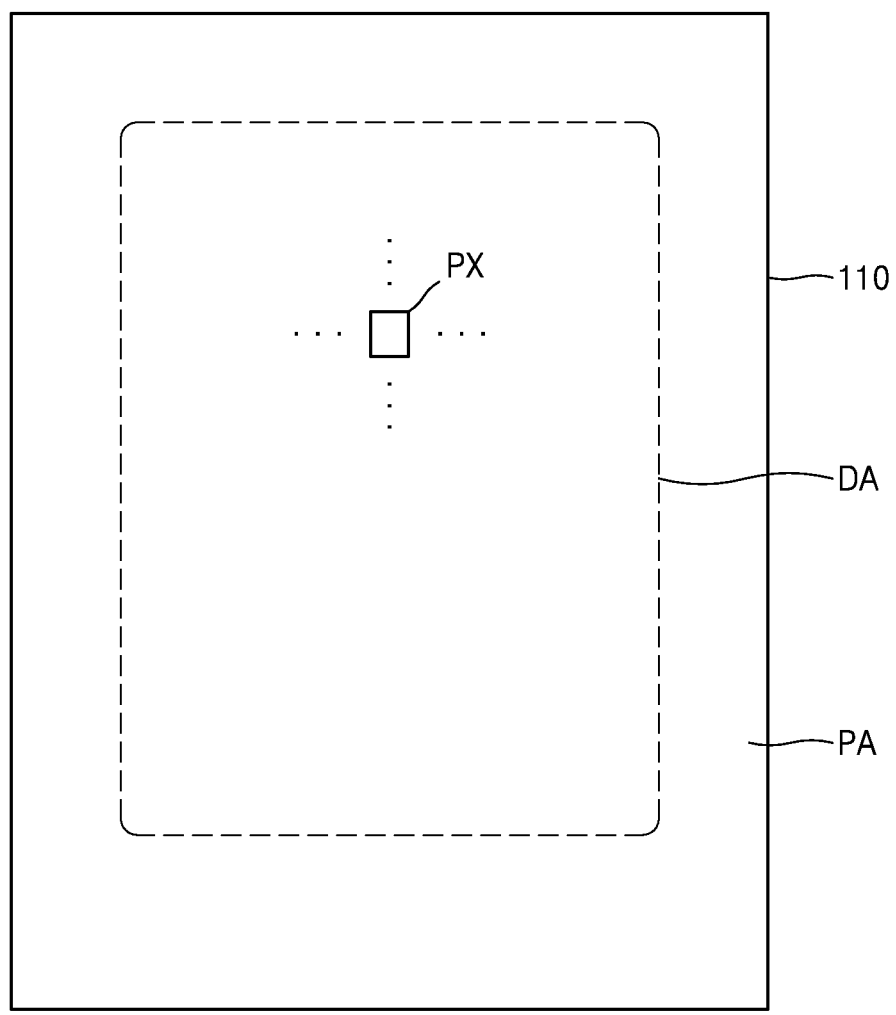
FIG. 1 is a plan view of a display device according to an embodiment.

As the present disclosure allows for various changes and numerous embodiments, exemplary embodiments will be illustrated in the drawings and described in detail in the written description. Effects and characteristics of present exemplary embodiments, and a method of accomplishing them will be apparent by referring to content described below in detail together with the drawings. However, the embodiments of the present disclosure are not limited to the exemplary embodiments described below and may be implemented in various forms.

Hereinafter, embodiments of the present disclosure are described in detail with reference to the accompanying drawings, and when descriptions are made with reference to the drawings, like or corresponding elements are given like reference numerals and repeated descriptions thereof are omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, one or more intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

As used herein, the term "and/or" includes any and all combinations of one or more of the associated listed items. Expressions such as "at least one of" when preceding a list of elements, modify the entire list of elements and do not modify the individual elements of the list.

FIG. 1 is a plan view of a display device according to an embodiment.

Pixels PX including various display elements such as an organic light-emitting diode (OLED) may be arranged in a display area DA of a substrate 110. Various wires transferring electric signals to be applied to the display area DA may be arranged in a peripheral area PA of the substrate 110. Hereinafter, for convenience of description, a display device including an organic light-emitting diode is described as a display element. However, the present disclosure is not limited thereto and is applicable to various types of display devices such as a liquid crystal display device, an electrophoretic display device, and an inorganic electroluminescence (EL) display device.

Figure 2:
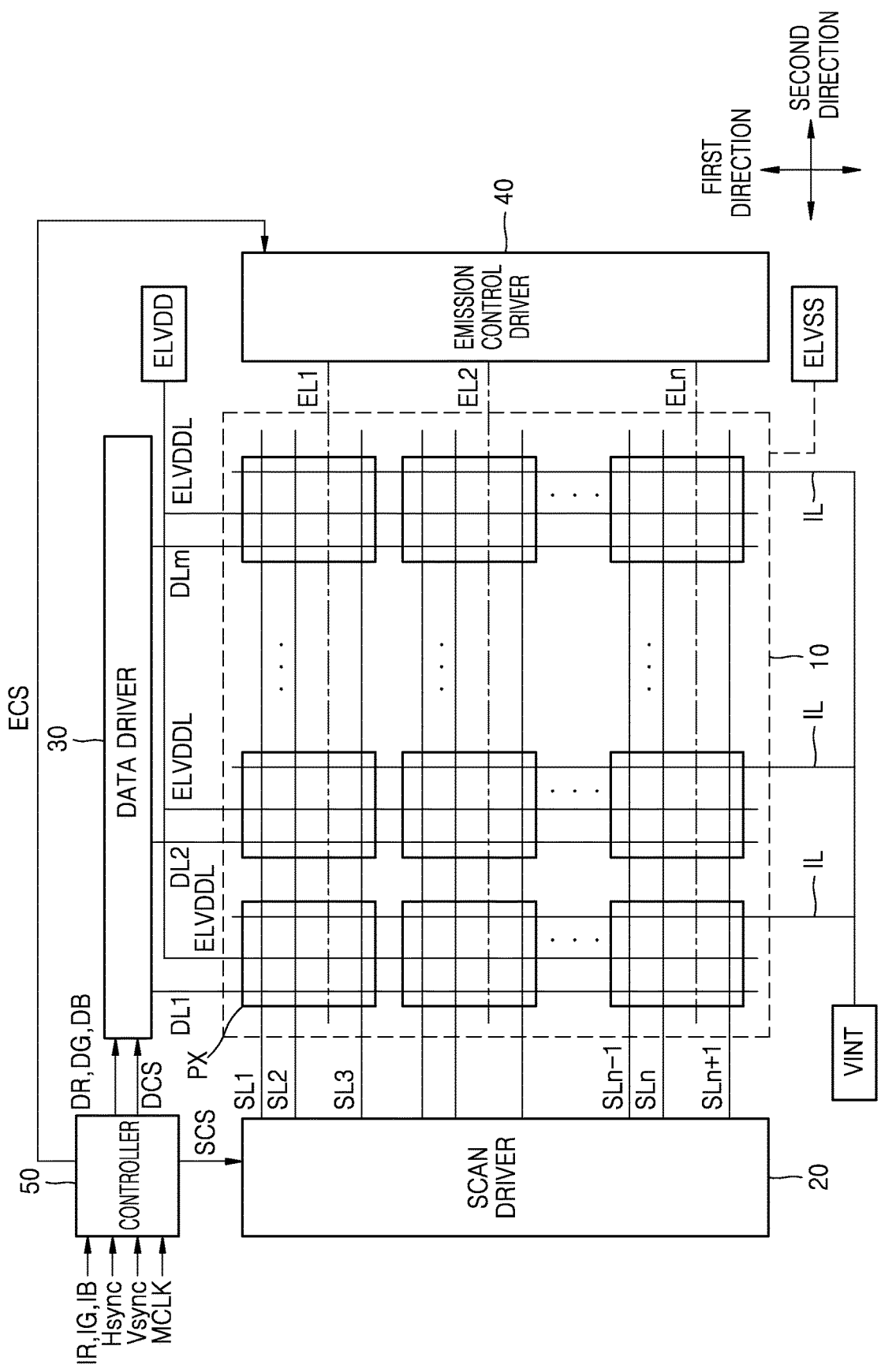
FIG. 2 is a block diagram of a display device according to an embodiment.

FIG. 2 is a block diagram of a display device according to an embodiment.

The display device according to an embodiment includes a display unit 10 including a plurality of pixels PX, a scan driver 20, a data driver 30, an emission control driver 40, and a controller 50.

The display unit 10 includes a plurality of pixels PX arranged substantially in a matrix in the display area DA at intersections of a plurality of scan lines SL1 to SLn+1, a plurality of data lines DL1 to DLm, and a plurality of emission control lines EL1 to ELn. The plurality of scan lines SL1 to SLn+1 and the plurality of emission control lines EL1 to ELn extend in a second direction or a row direction, and the plurality of data lines DL1 to DLm and driving voltage lines ELVDDL extend in a first direction or a column direction. In one pixel line, an n value of the plurality of scan lines SL1 to SLn+1 may be different from an n value of the plurality of emission control lines EL1 to ELn.

According to one embodiment, each pixel PX is connected to three scan lines among the plurality of scan lines SL1 to SLn+1. The scan driver 20 generates three scan signals and transfers the scan signals to each pixel PX through the plurality of scan lines SL1 to SLn+1. For example, the scan driver 20 sequentially supplies scan signals to the scan lines SL2 to SLn, the previous scan lines SL1 to SLn−1, or the next scan lines SL3 to SLn+1.

An initialization voltage line IL may receive an initialization voltage from an external power source VINT and supply the same to each pixel PX.

In addition, each pixel PX is connected to one of the plurality of data lines DL1 to DLm, and connected to one of the plurality of emission control lines EL1 to ELn.

The data driver 30 transfers a data signal to each pixel PX through the plurality of data lines DL1 to DLm. The data signal is supplied to the corresponding pixel PX that is selected by a scan signal whenever the scan signal is supplied to the scan lines SL1 to SLn.

The emission control driver 40 generates an emission control signal and transfers the same to each pixel PX through the plurality of emission control lines EL1 to ELn. The emission control signal controls an emission time of the pixel PX. The emission control driver 40 may be omitted depending on the structure of the pixel PX.

The controller 50 changes a plurality of image signals IR, IG, and IB transferred from the outside to a plurality of image data signals DR, DG, and DB, and transfers the same to the data driver 30. In addition, the controller 50 may receive a vertical synchronization signal Vsync, a horizontal synchronization signal Hsync, and a clock signal MCLK, generate control signals for controlling the scan driver 20, the data driver 30, and the emission control driver 40, and respectively transfer the generated signals to the relevant drivers. That is, the controller 50 generates a scan driving control signal SCS controlling the scan driver 20, a data driving control signal DCS controlling the data driver 30, and an emission driving control signal ECS controlling the emission control driver 40, and respectively transfers the generated signals to the relevant drivers.

Each of the pixels PX receives a driving power voltage ELVDD that is input from the outside, and a common power voltage ELVSS. The driving power voltage ELVDD may be a predetermined high-level voltage, and the common power voltage ELVSS may be a voltage that is lower than the driving power voltage ELVDD or a ground voltage. The driving power voltage ELVDD is supplied to each pixel PX through a driving voltage line ELVDDL.

Each of the pixels PX emits light of certain brightness based on a driving current supplied to a light-emitting element in response to a data signal transferred through the data lines DL1 to DLm.

Figure 3:
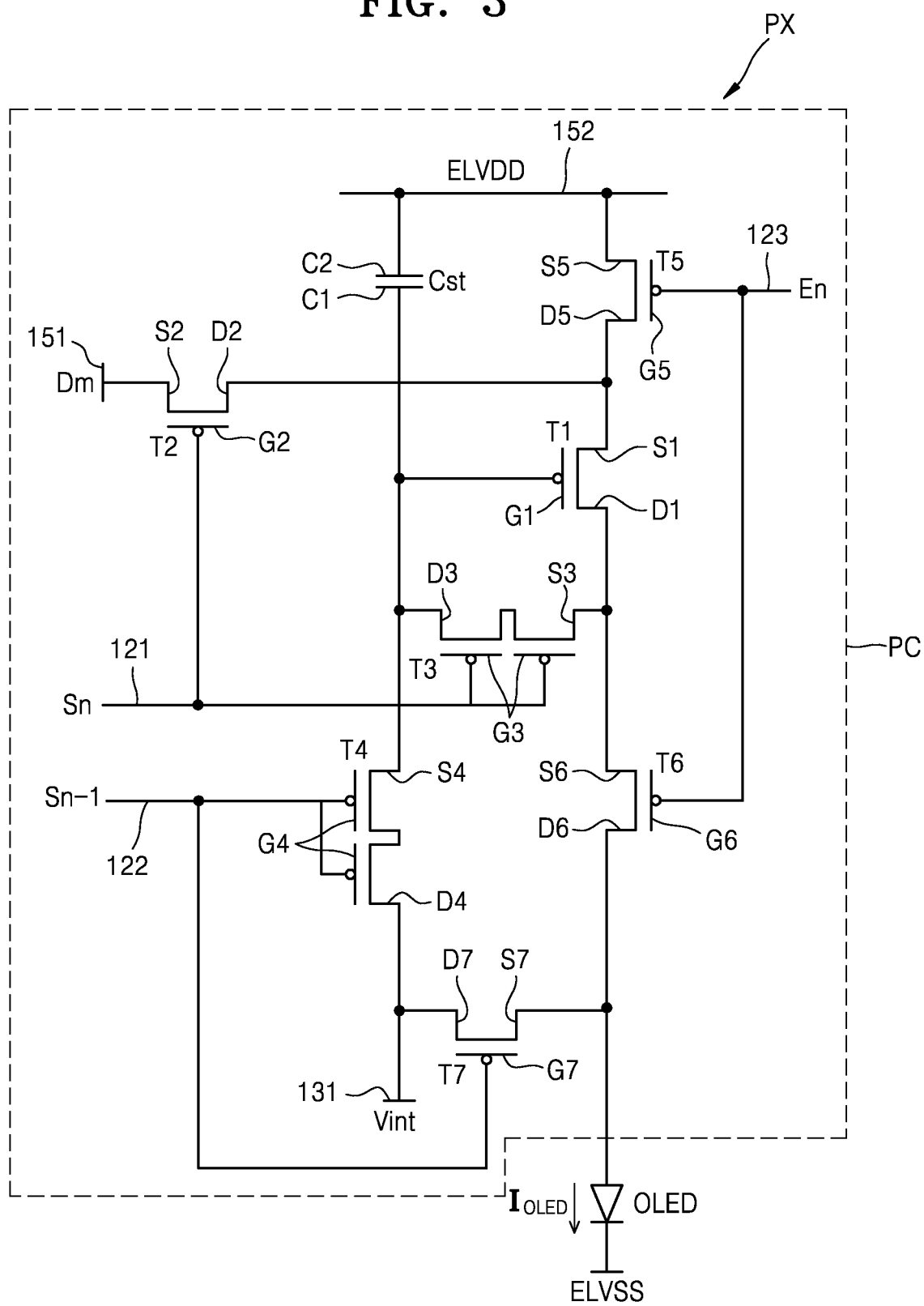
FIG. 3 is an equivalent circuit diagram of one pixel of the display device shown in FIG. 1.

FIG. 3 is an equivalent circuit diagram of one pixel of the display device shown in FIG. 1.

Referring to FIG. 3, each pixel PX includes a pixel circuit PC that is connected to signal lines 121, 122, 123, and 151, an initialization voltage line 131, and a driving voltage line 152, and a light-emitting element connected to the pixel circuit PC, in the present example, an organic light-emitting diode OLED.

The pixel circuit PC includes a plurality of thin film transistors (TFTs) T1, T2, T3, T4, T5, T6, and T7, and a storage capacitor Cst.

Although FIG. 3 illustrates a case where the signal lines 121, 122, 123, and 151, the initialization voltage line 131, and the driving voltage line 152 are provided for each pixel PX, the present embodiment is not limited thereto. In another embodiment, at least one of the signal lines 121, 122, 123, and 151, and/or the initialization voltage line 131 may be shared with the adjacent pixels.

The TFTs may include a driving TFT T1, a switching TFT T2, a compensation TFT T3, a first initialization TFT T4, an operation control TFT T5, an emission control TFT T6, and a second initialization TFT T7.

The signal lines include a scan line 121 transferring a scan signal Sn, a previous scan line 122 transferring a previous scan signal Sn−1 to the first initialization TFT T4 and the second initialization TFT T7, an emission control line 123 transferring an emission control signal En to the operation control TFT T5 and the emission control TFT T6, and a data line 151 crossing the scan line 121 and transferring a data signal Dm. The driving voltage line 152 transfers the driving voltage ELVDD to the driving TFT T1, and the initialization voltage line 131 transfers the initialization voltage Vint to initialize the driving TFT T1 and a pixel electrode of the organic light-emitting diode OLED.

A driving gate electrode G1 of the driving TFT T1 is connected to a first electrode C1 of the storage capacitor Cst, a driving source electrode S1 of the driving TFT T1 is connected to the driving voltage line 152 via the operation control TFT T5, and a driving drain electrode D1 of the driving TFT T1 is electrically connected to the pixel electrode of the organic light-emitting diode OLED via the emission control TFT T6. The driving TFT T1 receives a data signal Dm and supplies a driving current $I_{OLED}$ to the organic light-emitting diode OLED in response to a switching operation of the switching TFT T2.

A switching gate electrode G2 of the switching TFT T2 is connected to the scan line 121, a switching source electrode S2 of the switching TFT T2 is connected to the data line 151, and a switching drain electrode D2 of the switching TFT T2 is connected to the driving source electrode S1 of the driving TFT T1 and simultaneously connected to the lower driving voltage line 152 via the operation control TFT T5. The switching TFT T2 is turned on in response to a scan signal Sn transferred through the scan line 121 and performs a switching operation of transferring the data signal Dm transferred through the data line 151 to the driving source electrode S1 of the driving TFT T1.

A compensation gate electrode G3 of the compensation TFT T3 is connected to the scan line 121, a compensation source electrode S3 of the compensation TFT T3 is connected to the driving drain electrode D1 of the driving TFT T1 and simultaneously connected to the pixel electrode of the organic light-emitting diode OLED via the emission control TFT T6, and a compensation drain electrode D3 of the compensation TFT T3 is connected to the first electrode C1 of the storage capacitor Cst, the first initialization source electrode S4 of the first initialization TFT T4, and the driving gate electrode G1 of the driving TFT T1. The compensation TFT T3 is turned on in response to the scan signal Sn transferred through the scan line 121 and diode-connects the driving TFT T1 by electrically connecting the driving gate electrode G1 to the driving drain electrode D1 of the driving TFT T1.

A first initialization gate electrode G4 of the first initialization TFT T4 is connected to the previous scan line 122, a first initialization drain electrode D4 of the first initialization TFT T4 is connected to a second initialization drain electrode D7 of the second initialization TFT T7 and the initialization voltage line 131, and a first initialization source electrode S4 of the first initialization TFT T4 is connected to the first electrode C1 of the storage capacitor Cst, the compensation drain electrode D3 of the compensation TFT T3, and the driving gate electrode G1 of the driving TFT T1. The first initialization TFT T4 is turned on in response to the previous scan signal Sn−1 transferred through the previous scan line 122 and performs an initialization operation of initializing a voltage of the driving gate electrode G1 of the driving TFT T1 by transferring the initialization voltage Vint to the driving gate electrode G1 of the driving TFT T1.

An operation control gate electrode G5 of the operation control TFT T5 is connected to the emission control line 123, an operation control source electrode S5 of the operation control TFT T5 is connected to the lower driving voltage line 152, and an operation control drain electrode D5 of the operation control TFT T5 is connected to the driving source electrode S1 of the driving TFT T1 and the switching drain electrode D2 of the switching TFT T2.

An emission control gate electrode G6 of the emission control TFT T6 is connected to the emission control line 123, an emission control source electrode S6 of the emission control TFT T6 is connected to the driving drain electrode D1 of the driving TFT T1 and the compensation source electrode S3 of the compensation TFT T3, and an emission control drain electrode D6 of the emission control TFT T6 is electrically connected to a second initialization source electrode S7 of the second initialization TFT T7 and the pixel electrode of the organic light-emitting diode OLED.

The operation control TFT T5 and the emission control TFT T6 are simultaneously turned on in response to the emission control signal En transferred through the emission control line 123 to allow the driving voltage ELVDD to be transferred to the organic light-emitting diode OLED and thus allowing the driving current $I_{OLED}$ to flow through the organic light-emitting diode OLED.

A second initialization gate electrode G7 of the second initialization TFT T7 is connected to the previous scan line 122, the second initialization source electrode S7 of the second initialization TFT is connected to the emission control drain electrode D6 of the emission control TFT T6 and the pixel electrode of the organic light-emitting diode OLED, and the second initialization drain electrode D7 of the second initialization TFT T7 is connected to the first initialization drain electrode D4 of the first initialization TFT T4 and the initialization voltage line 131. The second initialization TFT T7 is turned on in response to the previous scan signal Sn−1 transferred through the previous scan line 122 to initialize the pixel electrode of the organic light-emitting diode OLED.

Although FIG. 3 illustrates a case where the first initialization TFT T4 and the second initialization TFT T7 are connected to the previous scan line 122, the embodiment is not limited thereto. In another embodiment, the first initialization TFT T4 may be connected to the previous scan line 122 and driven in response to a previous scan signal Sn−1, and the second initialization TFT T7 may be connected to a separate signal line (for example, a next scan line Sn+1) and driven in response to a signal transferred through the separate signal line. Meanwhile, locations of the source electrodes S1 to S7 and the drain electrodes D1 to D7 shown in FIG. 3 may change depending on a type (p-type or n-type) of the transistors.

A specific operation of each pixel PX according to an embodiment is described below.

During an initialization period, when the previous scan signal Sn−1 is supplied through the previous scan line 122, the first initialization TFT T4 is turned on in response to the previous scan signal Sn−1, and the driving TFT T1 is initialized by the initialization voltage Vint supplied through the initialization voltage line 131.

During a data programming period, when the scan signal Sn is supplied through the scan line 121, the switching TFT T2 and the compensation TFT T3 are turned on in response to the scan signal Sn. In this case, the driving TFT T1 is diode-connected and forward-biased by the turned-on compensation TFT T3.

Then, a compensation voltage Dm+Vth that is reduced (or compensated) from the data signal Dm by a threshold voltage Vth of the driving TFT T1 (the data signal Dm is supplied through the data line 151 and Vth has a negative value) is applied to the driving gate electrode G1 of the driving TFT T1.

The driving voltage ELVDD and the compensation voltage Dm+Vth are applied to two opposite ends of the storage capacitor Cst, and a charge corresponding to a voltage difference between the two opposite ends is stored in the storage capacitor Cst.

During an emission period, the operation control TFT T5 and the emission control TFT T6 are turned on in response to the emission control signal En supplied through the emission control line 123. The driving current $I_{OLED}$ corresponding to a voltage difference between a voltage of the gate electrode G1 of the driving TFT T1 and the driving voltage ELVDD is supplied to the organic light-emitting diode OLED through the emission control TFT T6.

Figure 4:
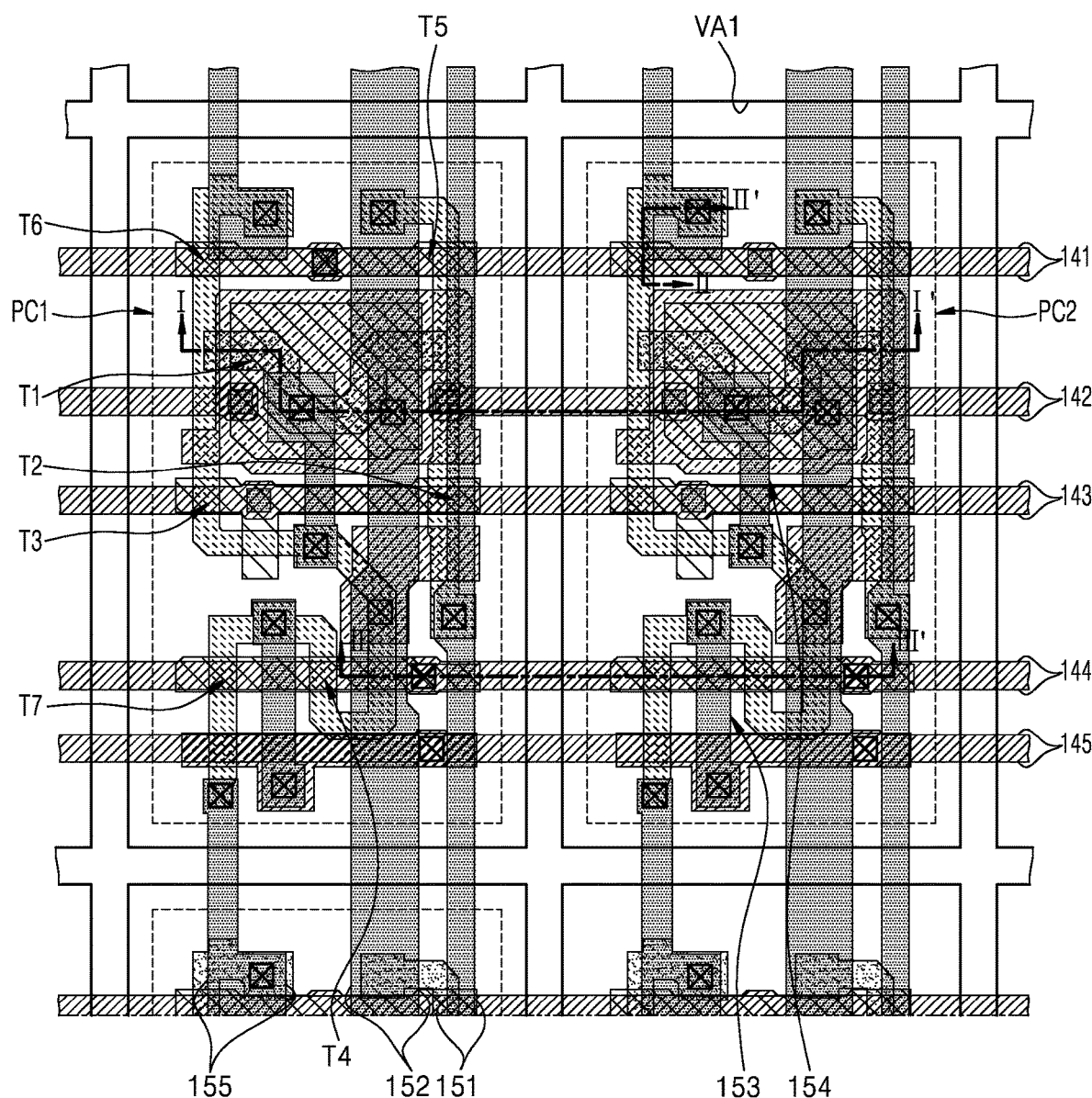
FIG. 4 is an arrangement view illustrating locations of a plurality of thin film transistors (TFTs), a storage capacitor, and two adjacent pixel circuits.
Figure 8:
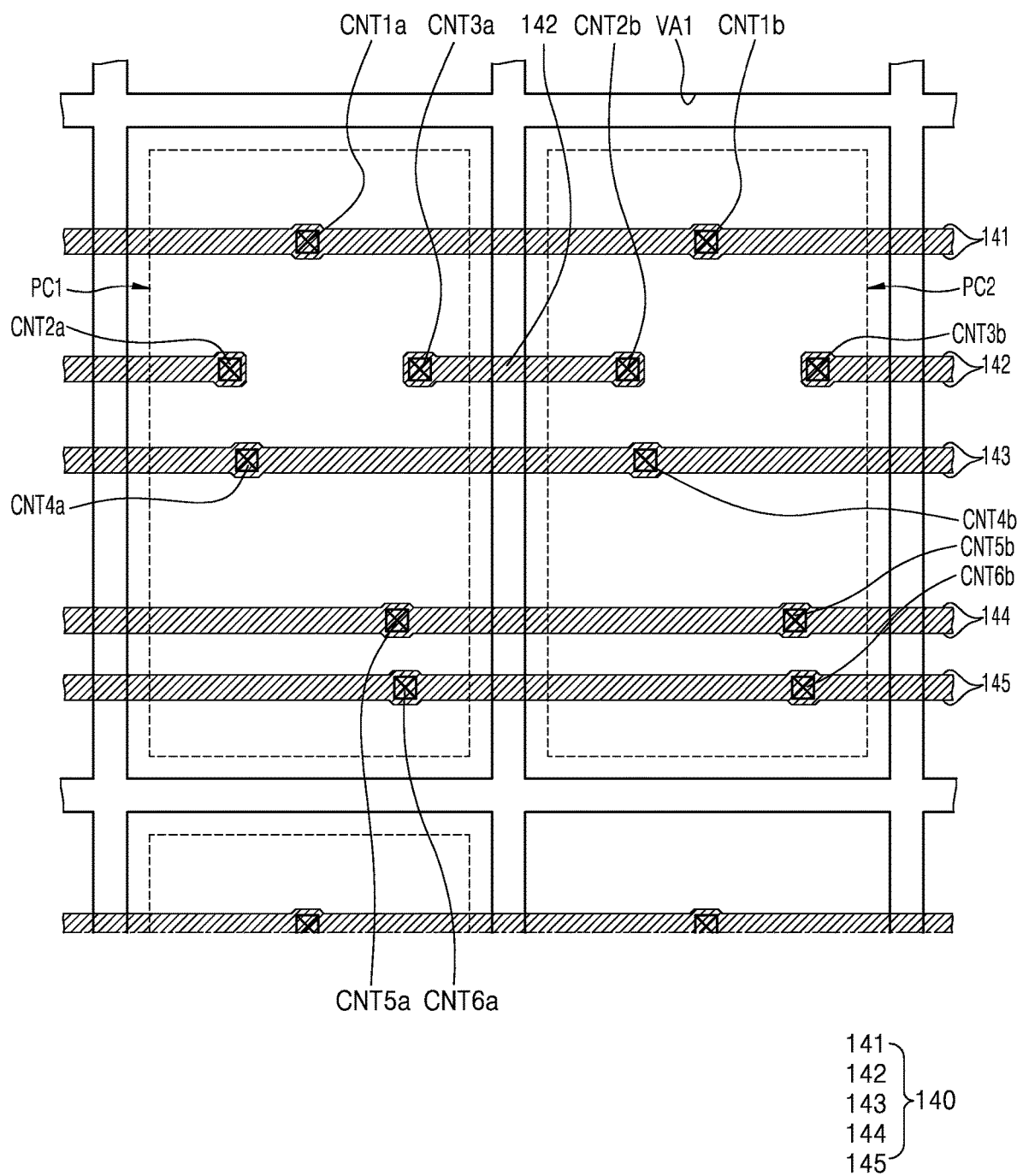
Figure 9:
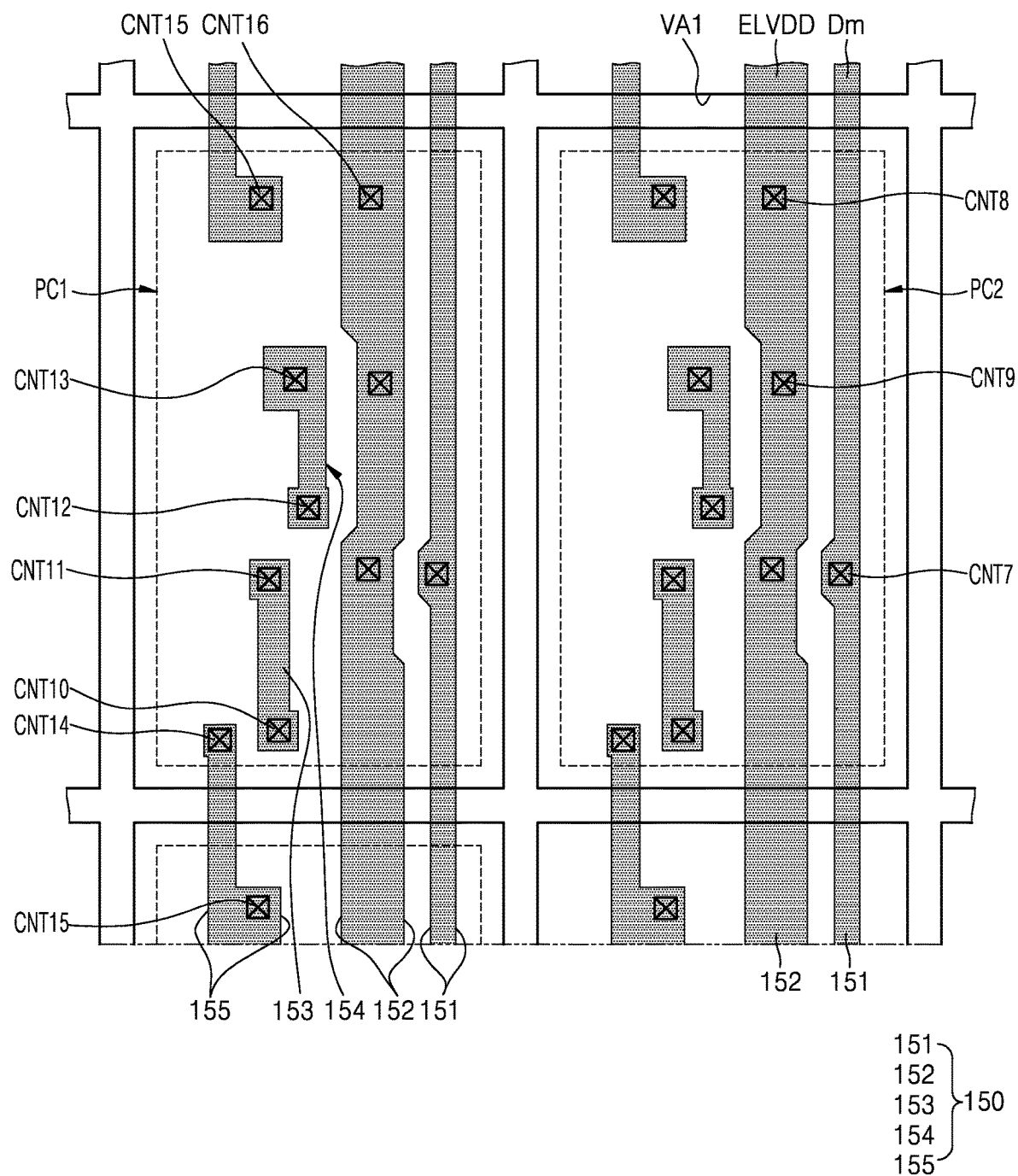
Figure 10:
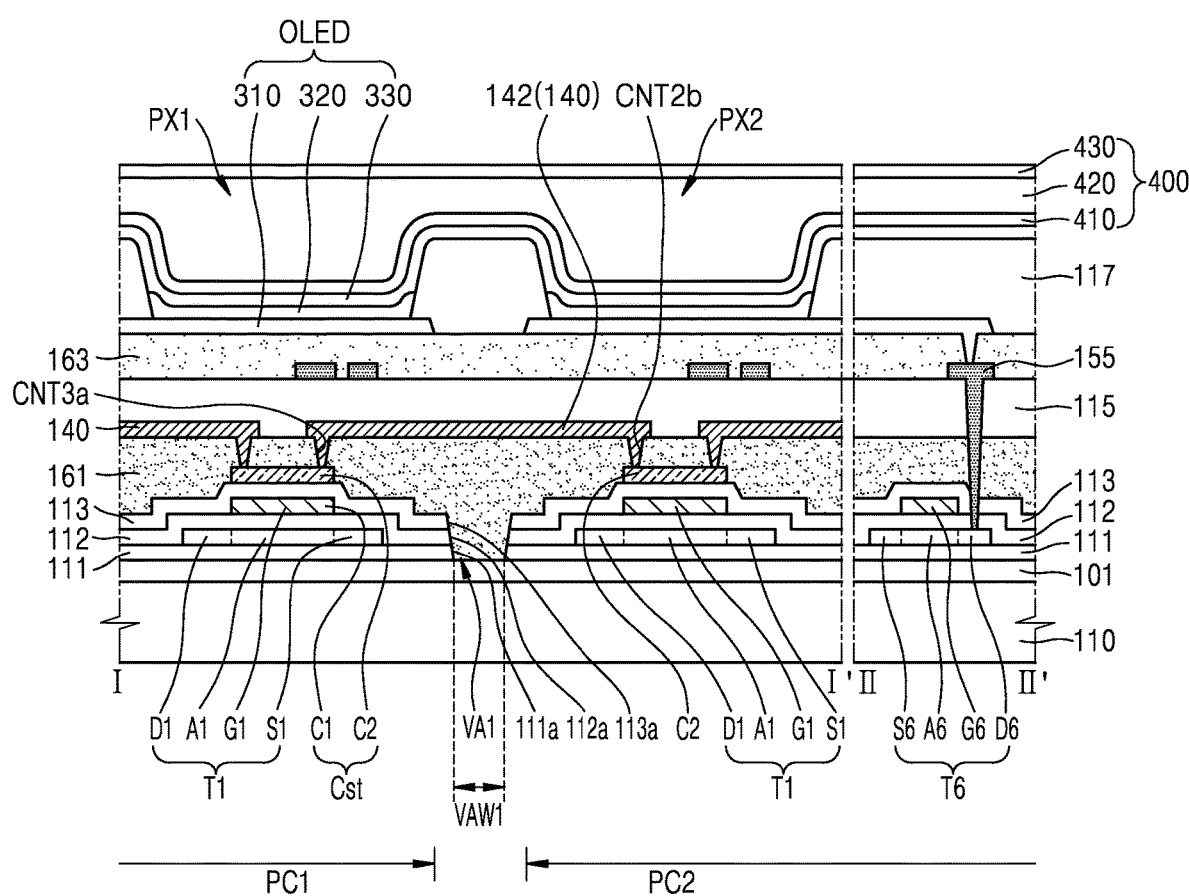
FIG. 10 is a cross-sectional view taken along lines I-I' and II-II' of FIG. 4.

FIG. 4 is an arrangement view illustrating locations of a plurality of TFTs, a storage capacitor, and two pixel circuits including first and second pixel circuits PC1 and PC2 that are disposed adjacent to each other in a display device according to an embodiment, FIGS. 5 to 9 are arrangement views illustrating, for each layer, elements such as the plurality of TFTs, and the storage capacitor illustrated in FIG. 4, and FIG. 10 is a cross-sectional view taken along lines I-I' and II-II' of FIG. 4.

Referring to FIGS. 4 to 10, the display device according to an embodiment includes an inorganic insulating layer having a lower valley VA1 in a region between the first and second pixel circuits PC1 and PC2, and a first organic planarization layer 161 filling the lower valley VA1. In the present specification, the lower valley VA1 refers to an opening or a groove formed by removing a portion of the inorganic insulating layer.

In addition, the display device may include a horizontal connection wire 140 arranged on the first organic planarization layer 161 and extending in a first direction, and/or a vertical connection wire 150 arranged on the first organic planarization layer 161 and extending in a second direction.

In an embodiment, a barrier layer 101, a buffer layer 111, a first gate insulating layer 112, and a second gate insulating layer 113 that are arranged below the horizontal connection wire 140 and including an inorganic material may be collectively referred to as an inorganic insulating layer. The inorganic insulating layer may include the lower valley VA1 formed as an opening or a groove in a region between adjacent pixel circuits.

FIG. 10 illustrates that the inorganic insulating layer has the lower valley VA1 formed as a groove. That is, the barrier layer 101 may continuously extend over the first pixel circuit PC1 and the second pixel circuit PC2 that are adjacent to each other. In addition, the buffer layer 111, the first gate insulating layer 112, and the second gate insulating layer 113 may respectively have openings 111a, 112a, and 113a in a region corresponding to the lower valley VA1.

Accordingly, the inorganic insulating layer including the barrier layer 101, the buffer layer 111, the first gate insulating layer 112, and the second gate insulating layer 113 may be understood as having the lower valley VA1 formed as a groove in a region between the adjacent pixels. The groove may denote a trench formed in the inorganic insulating layer.

An opening of the inorganic insulating layer may denote a structure in which openings are formed in the buffer layer 111, the first gate insulating layer 112, and the second gate insulating layer 113 to expose a portion of the barrier layer 101. In some embodiments, the opening of the inorganic insulating layer may extend through the barrier layer 101 and exposes a portion of the substrate 110 (see FIG. 14).

The inorganic insulating layer may include various types of grooves that are different from the above groove. For example, a portion of an upper surface of the barrier layer 101 may be removed, and unlike this, a lower surface of the buffer layer 111 may not be removed. Various modifications may be made.

A width VAW1 of the lower valley VA1 of the inorganic insulating layer may be in the order of μm. For example, the width VAW1 of the lower valley VA1 of the inorganic insulating layer may have a value between about 5 μm to about 10 μm.

After the second gate insulating layer 113 is formed, the lower valley VA1 may be formed as an opening or a groove by performing a separate mask process and an etching process. The openings 111a, 112a, and 113a respectively of the buffer layer 111, the first gate insulating layer 112, and the second gate insulating layer 113 may be formed by the etching process. The etching process may be a dry etching process.

The first organic planarization layer 161 may fill the lower valley VA1 of the inorganic insulating layer. The first organic planarization layer 161 may be arranged over the entire regions of the first pixel circuit PC1 and the second pixel circuit PC2 while filling the lower valley VA1. The horizontal connection wire 140 and the vertical connection wire 150 are arranged on the first organic planarization layer 161.

At least a portion of the lower valley VA1 of the inorganic insulating layer may be arranged between a plurality of pixel circuits. In FIG. 4, the lower valley VA1 of the inorganic insulating layer surrounds the first and second pixel circuits PC1 and PC2. That is, the lower valley VA1 surrounds a circumference of the first pixel circuit PC1 and a circumference of the second pixel circuit PC2. However, the present embodiment is not limited thereto.

For example, the lower valley VA1 of the inorganic insulating layer may extend in a second direction in a region between the first pixel circuit PC1 and the second pixel circuit PC2 without entirely surrounding the first and second pixel circuits PC1 and PC2. Alternatively, the lower valley VA1 of the inorganic insulating layer may extend in the first direction in a region between a plurality of pixels. Various modifications may be made.

The lower valley VA1 of the inorganic insulating layer and the first organic planarization layer 161 filling the lower valley VA1 may reduce an influence of an external impact on the display device. Since the hardness of the inorganic insulating layer is higher than that of the first organic planarization layer 161, a crack may occur in the inorganic insulating layer due to an external impact. When a crack occurs in the inorganic insulating layer, a probability that a crack occurs in various signal lines arranged in or on the inorganic insulating layer and a defect such as disconnection in the signal lines occurs is high.

In contrast, in the case of the display device according to the present embodiment, since the inorganic insulating layer includes the lower valley VA1 between a plurality of pixel circuits and the first organic planarization layer 161 fills the lower valley VA1, a probability that a crack propagates through the inorganic insulating layer is reduced. In addition, since the hardness of the first organic planarization layer 161 is less than that of an inorganic material layer, the first organic planarization layer 161 may absorb the stress caused by an external impact and thus effectively reduce concentration of the stress on the horizontal and vertical connection wires 140 and 150 arranged on the first organic planarization layer 161.

In addition, since the first organic planarization layer 161 is arranged over the entire regions of the plurality of pixel circuits to provide a flat upper surface, a probability of defect occurrence may be drastically reduced in manufacturing the horizontal and vertical connection wires 140 and 150.

The horizontal connection wire 140 and the vertical connection wire 150 may be arranged on the first organic planarization layer 161 to connect a plurality of pixel circuits to one another. The horizontal connection wire 140 and the vertical connection wire 150 may serve as wires transferring electric signals to the plurality of pixel circuits.

Hereinafter, a display device according to an embodiment is described with reference to FIGS. 4 to 10 in detail. FIG. 4 illustrates a plan view of the first and second pixel circuits PC1 and PC2, and an organic light-emitting diode connected to each pixel circuit is omitted. FIG. 10 illustrates a schematic cross-section of pixels PX1 and PX2 in which an organic light-emitting diode OLED is connected to the first and second pixel circuits PC1 and PC2.

Each of FIGS. 5 to 9 illustrates arrangements of a wire, an electrode, a semiconductor layer, etc. that are arranged in the same layer, and an insulating layer may be arranged between the layers illustrated in FIGS. 5 to 8. For example, the first gate insulating layer 112 (see FIG. 10) may be arranged between a layer illustrated in FIG. 5 and a layer illustrated in FIG. 6. The second gate insulating layer 113 (see FIG. 10) may be arranged between a layer illustrated in FIG. 6 and a layer illustrated in FIG. 7. The first organic planarization layer 161 (see FIG. 10) may be arranged between a layer illustrated in FIG. 7 and a layer illustrated in FIG. 8. An interlayer insulating layer 115 (see FIG. 10) may be arranged between a layer illustrated in FIG. 8 and a layer illustrated in FIG. 9. The layers illustrated in FIGS. 5 to 9 may be electrically connected to one another through one or more contact holes defined in at least some of the above-described insulating layers.

Figure 5:
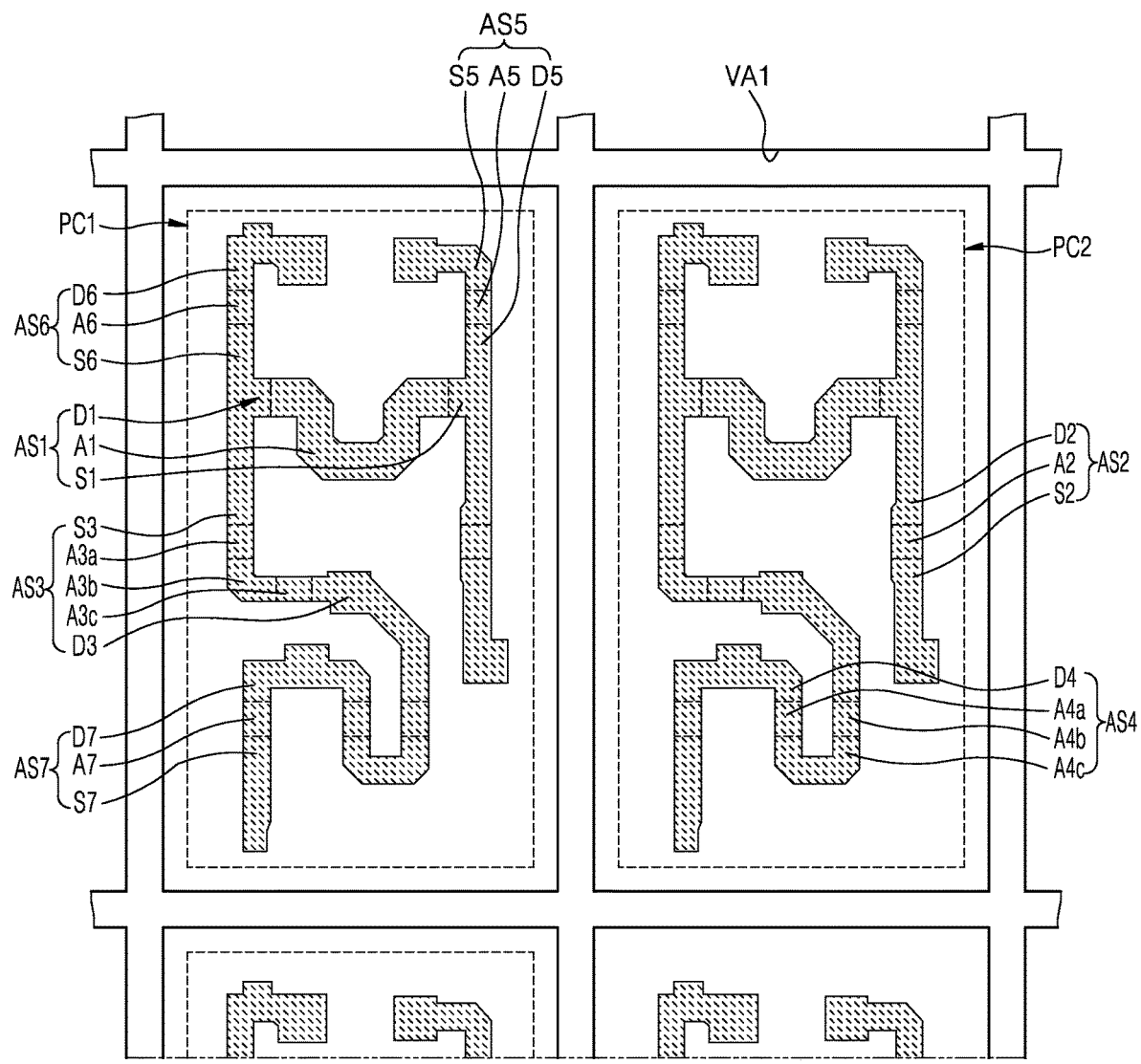
FIGS. 5 to 9 are arrangement views illustrating, for each layer, elements such as the plurality of TFTs, the storage capacitor, and the pixel electrode illustrated in FIG. 4.

Referring to FIGS. 4, 5, and 10, semiconductor layers AS1 to AS7 respectively of the driving TFT T1, the switching TFT T2, the compensation TFT T3, the first initialization TFT T4, the operation control TFT T5, the emission control TFT T6, and the second initialization TFT T7 are arranged in the same layer and may include the same material. For example, the semiconductor layers AS1 to AS7 may include polycrystalline silicon.

The semiconductor layers AS1 to AS7 are arranged on the buffer layer 111 (see FIG. 10) arranged over the substrate 110. The substrate 110 may include a glass material, a metal material, or a plastic material such as polyethylene terephthalate, polyethylene naphthalate, and polyimide. The buffer layer 111 may include an oxide layer such as SiOx and/or a nitride layer such as SiNx.

The substrate 110 may include a glass material, a ceramic material, a metal material, or a flexible or bendable material. In the case where the substrate 110 includes a flexible or bendable material, the substrate 110 may include a polymer resin such as polyethersulphone, polyacrylate, polyetherimide, polyethyelene napthalate, polyethylene terephthalate, polyphenylene sulfide, polyarylate, polyimide, polycarbonate, or cellulose acetate propionate. The substrate 110 may have a single-layered or multi-layered structure including one or more of the above-listed materials. The multi-layered structure may further include an inorganic layer. In an embodiment, the substrate 110 may have a stacked structure of an organic material/inorganic material/organic material.

The barrier layer 101 may be further arranged between the substrate 110 and the buffer layer 111. The barrier layer 101 may prevent or reduce penetration of impurities from the substrate 110, etc. into the semiconductor layers AS1 to AS7. The barrier layer 101 may include an inorganic material, an organic material, or an organic/inorganic composite material, and may include a single or multi-layered structure of an inorganic material and an organic material.

The buffer layer 111 may increase planarization of an upper surface of the substrate 110 and include an inorganic material such as a silicon oxide, a silicon nitride, and/or a silicon oxynitride.

A driving semiconductor layer (i.e., the semiconductor layer AS1) of the driving TFT T1, a switching semiconductor layer (i.e., the semiconductor layer AS2) of the switching TFT T2, a compensation semiconductor layer (i.e., the semiconductor layer AS3) of the compensation TFT T3, a first initialization semiconductor layer (i.e., the semiconductor layer AS4) of the first initialization TFT T4, an operation control semiconductor layer (i.e., the semiconductor layer AS5) of the operation control TFT T5, an emission control semiconductor layer (i.e., the semiconductor layer AS6) of the emission control TFT T6, and a second initialization semiconductor layer (i.e., the semiconductor layer AS7) of the second initialization TFT T7 may be connected to one another and bent in various shapes.

Each of the semiconductor layers AS1 to AS7 may include a channel region, and a source region and a drain region respectively at opposite sides of the channel region. For example, the source region and the drain region may be doped with impurities, and the impurities may include N-type impurities or P-type impurities. The source region and the drain region respectively correspond to a source electrode and a drain electrode. Hereinafter, terms "a source region" and "a drain region" are respectively used instead of a source electrode or a drain electrode.

The driving semiconductor layer, i.e., the semiconductor layer AS1, includes a driving channel region A1, a driving source region S1 and a driving drain region D1 that are arranged respectively at opposite sides of the driving channel region A1. The semiconductor layer AS1 may have a bent shape and thus the driving channel region A1 may be formed longer than the other channel regions A2 to A7. For example, the semiconductor layer AS1 may form a long channel in a narrow space by having a shape bent a plurality of number of times such as an omega shape or the letter "5". Since the driving channel region A1 is formed to be long, a driving range of a gate voltage applied to the driving gate electrode G1 is widened and thus a gray scale of light emitted from an organic light-emitting diode OLED may be controlled more delicately, and the display quality may improve.

The switching semiconductor layer, i.e., the semiconductor layer AS2, includes a switching channel region A2, and a switching source region S2 and a switching drain region D2 that are arranged respectively at opposite sides of the switching channel region A2. The switching drain region D2 is connected to the driving source region S1.

The compensation semiconductor layer, i.e., the semiconductor layer AS3, includes compensation channel regions A3a and A3c, and a compensation source region S3 and a compensation drain region D3 that are arranged respectively at opposite sides of the compensation channel regions A3a and A3c. The compensation TFT T3 formed in the semiconductor layer AS3 includes dual transistors and the two compensation channel regions A3a and A3c. A region A3b between the compensation channel regions A3a and A3c is a region doped with impurities and locally serves as a source region of one of the dual transistors and simultaneously serves as a drain region of the other dual transistor.

The first initialization semiconductor layer, i.e., the semiconductor layer AS4, includes first initialization channel regions A4a and A4c, and a first initialization source region S4 and a first initialization drain region D4 that are arranged respectively at opposite sides of the first initialization channel regions A4a and A4c. The first initialization TFT T4 formed in the semiconductor layer AS4 includes dual transistors and the two first initialization channel regions A4a and A4c. A region A4b between the first initialization channel regions A4a and A4c is a region doped with impurities and locally serves as a source region of one of the dual transistors and simultaneously serves as a drain region of the other dual transistor.

The operation control semiconductor layer, i.e., the semiconductor layer AS5, includes an operation control channel region A5, and an operation control source region S5 and an operation control drain region D5 that are arranged respectively at opposite sides of the operation control channel region A5. The operation control drain region D5 may be connected to the driving source region S1.

The emission control semiconductor layer, i.e., the semiconductor layer AS6, includes an emission control channel region A6, and an emission control source region S6 and an emission control drain region D6 that are arranged respectively at opposite sides of the emission control channel region A6. The emission control source region S6 may be connected to the driving drain region D1.

The second initialization semiconductor layer, i.e., the semiconductor layer AS7, includes a second initialization channel region A7, and a second initialization source region S7 and a second initialization drain region D7 that are arranged respectively at opposite sides of the second initialization channel region A7.

The first gate insulating layer 112 is arranged on the semiconductor layers AS1 to AS7. The first gate insulating layer 112 may include an inorganic material including an oxide or a nitride. For example, the first gate insulating layer 112 may include $SiO_2$, SiNx, SiON, $Al_2O_3$, $TiO_2$, $Ta_2O_5$, $HfO_2$, or $ZnO_2$.

In the present embodiment, the semiconductor layers AS1 to AS7 of adjacent pixel circuits are separated from one another. For example, the semiconductor layers AS1 to AS7 of the first pixel circuit PC1 are spaced apart from the semiconductor layers AS1 to AS7 of the second pixel circuit PC2.

Figure 6:
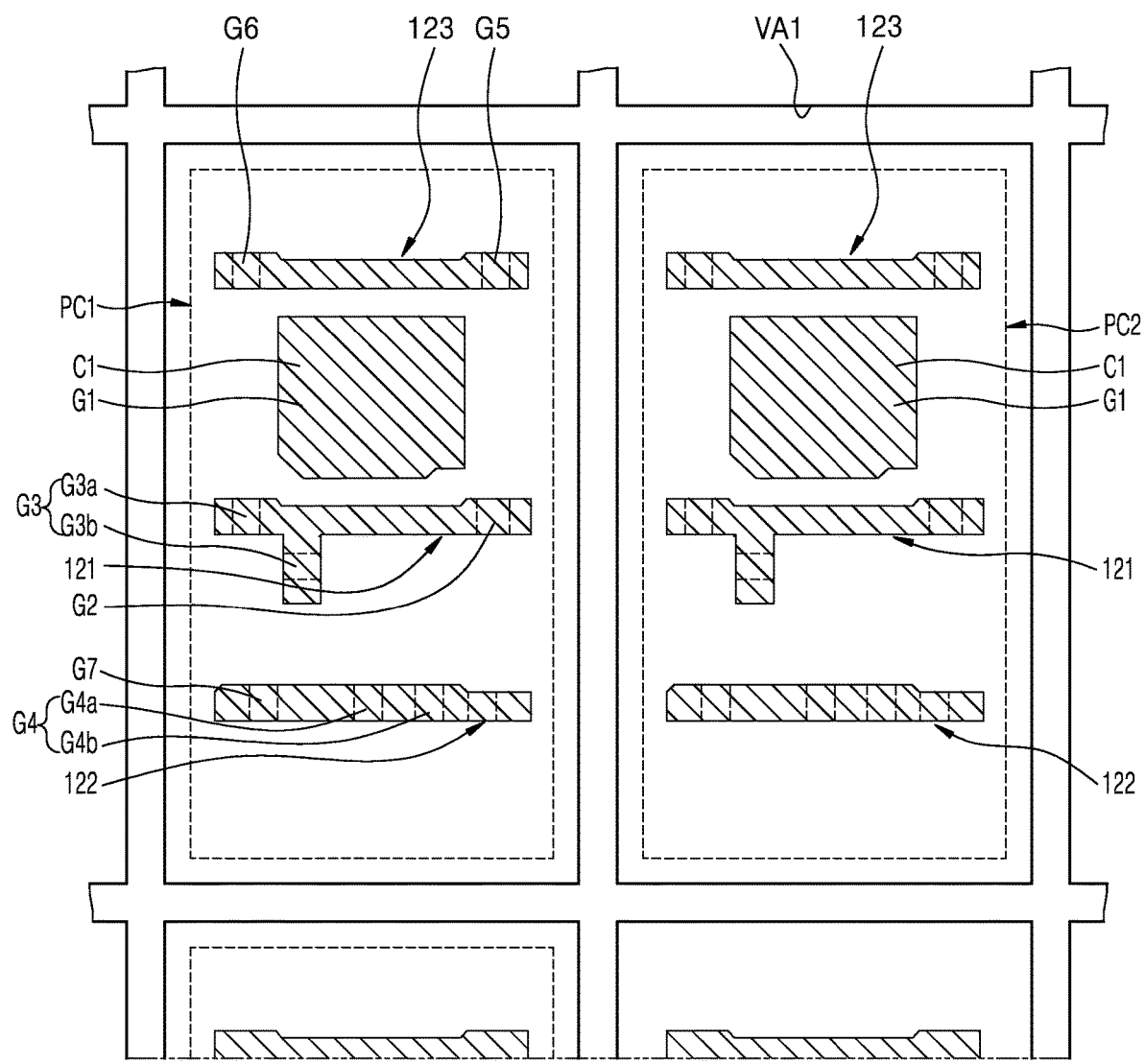

Referring to FIGS. 4, 6, and 10, the scan line 121, the previous scan line 122, the emission control line 123, and the driving gate electrode G1 are arranged over the first gate insulating layer 112. The scan line 121, the previous scan line 122, the emission control line 123, and the driving gate electrode G1 are arranged in the same layer, and may include the same material. For example, the scan line 121, the previous scan line 122, the emission control line 123, and the driving gate electrode G1 may include Mo, Cu, and Ti, and include a single layer or a multi-layer.

The driving gate electrode G1 is an island-type electrode and overlaps the driving channel region A1 of the semiconductor layer AS1. The driving gate electrode G1 serves as not only the gate electrode of the driving TFT T1 but also a first electrode C1 of the storage capacitor Cst. That is, the driving gate electrode G1 and the first electrode C1 may be understood as a single body.

Portions or protruding parts of the scan line 121, the previous scan line 122, and the emission control line 123 correspond to the gate electrodes of the TFTs T2 to T7.

Regions of the scan line 121 overlapping the switching channel region A2 and the compensation channel regions A3a and A3c respectively correspond to the switching gate electrode G2 and compensation gate electrodes G3a and G3b of the compensation gate electrode G3. Regions of the previous scan line 122 overlapping the first initialization channel regions A4a and A4c and the second initialization channel region A7 respectively correspond to first initialization gate electrodes G4a and G4b of the first initialization gate electrode G4, and the second initialization gate electrode G7. Regions of the emission control line 123 overlapping the operation control channel region A5 and the emission control channel region A6 respectively correspond to the operation control gate electrode G5 and the emission control gate electrode G6.

The compensation gate electrodes G3a and G3b are dual gate electrodes including the first compensation gate electrode G3a and the second compensation gate electrode G3b and may prevent or reduce occurrence of a leakage current.

In the present embodiment, the scan lines 121, the previous scan lines 122, the emission control lines 123, and the driving gate electrodes G1 of adjacent pixel circuits are separated from one another. For example, the scan line 121, the previous scan line 122, the emission control line 123, and the driving gate electrode G1 of the first pixel circuit PC1 are respectively spaced apart from the scan line 121, the previous scan line 122, the emission control line 123, and the driving gate electrode G1 of the second pixel circuit PC2.

Here, the scan line 121, the previous scan line 122, and the emission control line 123 of the first pixel circuit PC1 may be respectively connected afterward to the scan line 121, the previous scan line 122, and the emission control line 123 of the second pixel circuit PC2 by the horizontal connection wire 140 arranged in a different layer.

The second gate insulating layer 113 is arranged over the scan line 121, the previous scan line 122, the emission control line 123, and the driving gate electrode G1. The second gate insulating layer 113 may include an inorganic material including an oxide or a nitride. For example, the second gate insulating layer 113 may include $SiO_2$, SiNx, SiON, $Al_2O_3$, $TiO_2$, $Ta_2O_5$, $HfO_2$, or $ZnO_2$.

Figure 7:
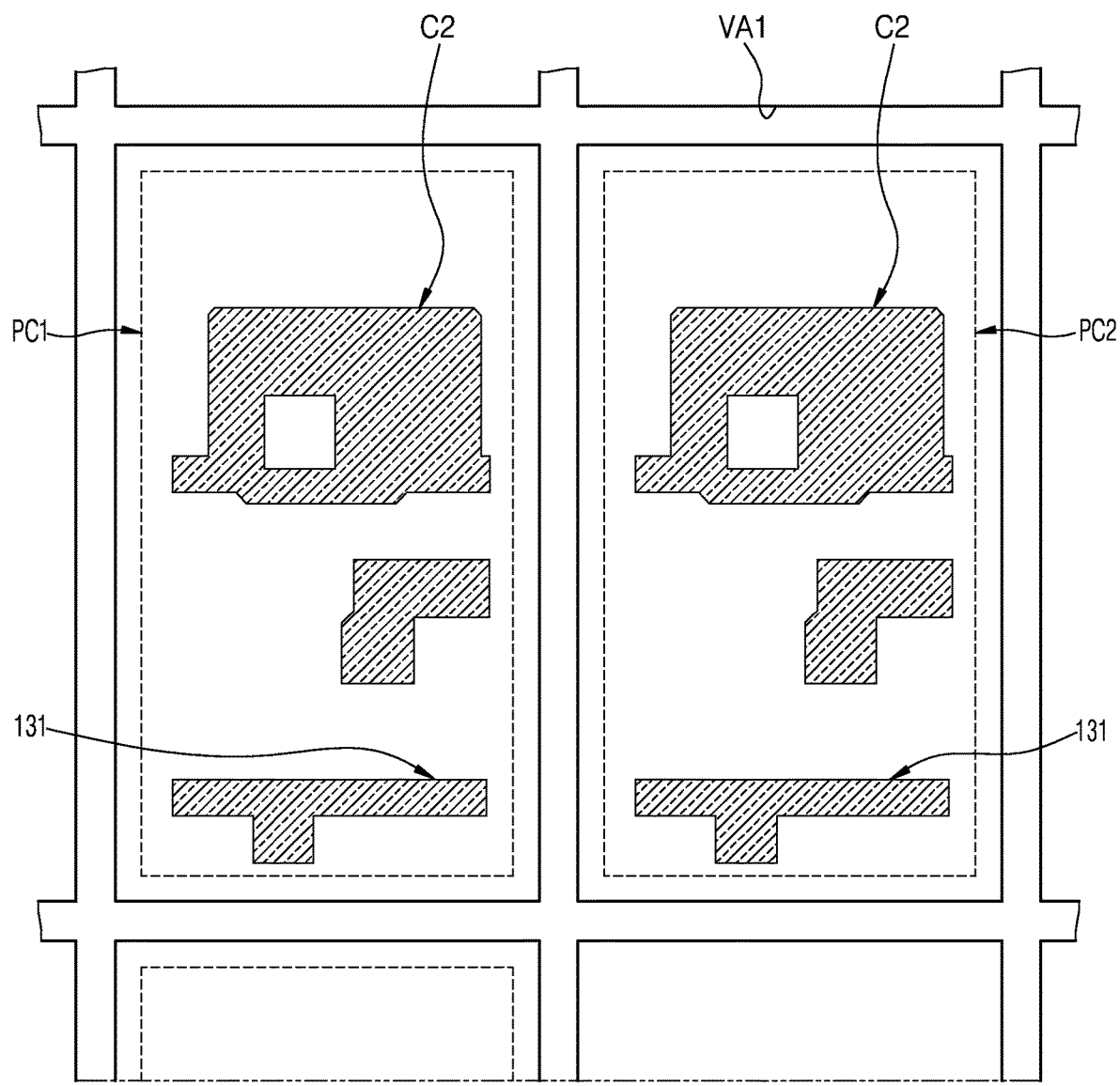

Referring to FIGS. 4, 7, and 10, a second electrode C2 of the storage capacitor Cst and the initialization voltage line 131 may be arranged on the second gate insulating layer 113.

The second electrode C2 of the storage capacitor Cst and the initialization voltage line 131 are arranged in the same layer and may include the same material. For example, the second electrode C2 of the storage capacitor Cst and the initialization voltage line 131 may include a conductive material including Mo, Cu, and Ti, and include a single layer or a multi-layer including one or more of the above-listed materials.

In the present embodiment, the second electrodes C2 of the storage capacitors Cst and the initialization voltage lines 131 of the first and second pixel circuits PC1 and PC2 are separated from each other. For example, the second electrode C2 of the storage capacitor Cst of the first pixel circuit PC1 is spaced apart from the second electrode C2 of the storage capacitor Cst of the second pixel circuit PC2, and the initialization voltage line 131 of the first pixel circuit PC1 is spaced apart from the initialization voltage line 131 of the second pixel circuit PC2.

The first organic planarization layer 161 is arranged on the second electrode C2 of the storage capacitor Cst and the initialization voltage line 131. The first organic planarization layer 161 may be arranged on the second electrode C2 of the storage capacitor Cst and the initialization voltage line 131 while filling the lower valley VA1 formed in the inorganic insulating layer.

The first organic planarization layer 161 may include one or more selected from the group consisting of acryl, methacrylic, polyester, polyethylene, polypropylene, polyethylene terephthalate, polyethylene naphthalate, polycarbonate, polyimide, polyethylene sulfonate, polyoxymethylene, polyarylate, and hexamethyldisiloxane. The first organic planarization layer 161 may function as a protective film covering TFTs T1 to T7 and may serve to planarize upper portions thereof. The first organic planarization layer 161 may be a single layer or a multilayer.

Referring to FIGS. 4, 8, and 10, the horizontal connection wire 140 extending in the first direction is arranged on the first organic planarization layer 161. The horizontal connection wire 140 extends from the first pixel circuit PC1 to the second pixel circuit PC2 and connects the first pixel circuit PC1 to the second pixel circuit PC2. The horizontal connection wire 140 may connect the pixels that are arranged in the first direction.

In the present embodiment, the semiconductor layers AS1 to AS7 arranged below the horizontal connection wire 140, and conductive layers such as the scan line 121, the previous scan line 122, the emission control line 123, the initialization voltage line 131, and the first electrode C1 and the second electrode C2 of the storage capacitor Cst are separated for each pixel circuit. Accordingly, propagation of stress that may occur from one pixel circuit to another pixel circuit may be prevented. Since the horizontal connection wire 140 may include a material having a high elongation property, a defect caused by stress may be reduced.

The horizontal connection wire 140 may include an emission control connection line 141, a mesh connection line 142, a scan connection line 143, a previous scan connection line 144, and an initialization voltage connection line 145.

The emission control connection line 141 connects the emission control line 123 of the first pixel circuit PC1 to the emission control line 123 of the second pixel circuit PC2 through contact holes CNT1a and CNT1b passing through the first organic planarization layer 161 and the second gate insulating layer 113. The emission control connection line 141 may overlap the emission control line 123 of the first pixel circuit PC1 and the emission control line 123 of the second pixel circuit PC2 and extend in the first direction.

The mesh connection line 142 connects the second electrode C2 of the first pixel circuit PC1 to the second electrode C2 of the second pixel circuit PC2 through contact holes CNT3a and CNT2b passing through the first organic planarization layer 161. Since the second electrode C2 of the storage capacitor Cst is connected to the driving voltage line 152 and thus receives a driving voltage, the mesh connection line 142 may transfer the driving voltage to the pixels arranged in the first direction. Due to the mesh connection line 142, a driving voltage line having a mesh structure may be formed without a separate driving voltage line extending in the first direction. Therefore, a space required for the storage capacitor Cst may be reduced, and thus a high-quality display device may be obtained.

The scan connection line 143 connects the scan line 121 of the first pixel circuit PC1 to the scan line 121 of the second pixel circuit PC2 through contact holes CNT4a and CNT4b passing through the first organic planarization layer 161 and the second gate insulating layer 113. The scan connection line 143 may overlap the scan line 121 of the first pixel circuit PC1 and the scan line 121 of the second pixel circuit PC2 and extend in the first direction.

The previous scan connection line 144 connects the previous scan line 122 of the first pixel circuit PC1 to the previous scan line 122 of the second pixel circuit PC2 through contact holes CNT5a and CNT5b passing through the first organic planarization layer 161 and the second gate insulating layer 113. The previous scan connection line 144 may overlap the previous scan line 122 of the first pixel circuit PC1 and the previous scan line 122 of the second pixel circuit PC2 and extend in the first direction.

The initialization voltage connection line 145 connects the initialization voltage line 131 of the first pixel circuit PC1 to the initialization voltage line 131 of the second pixel circuit PC2 through contact holes CNT6a and CNT6b passing through the first organic planarization layer 161. The initialization voltage connection line 145 may overlap the initialization voltage line 131 of the first pixel circuit PC1 and the initialization voltage line 131 of the second pixel circuit PC2 and extend in the first direction.

As described above, since the horizontal connection wire 140 connects the first pixel circuit PC1 to the second pixel circuit PC2, the horizontal connection wire 140 may supply electric signals to the connected pixels.

The interlayer insulating layer 115 may be arranged on the horizontal connection wire 140. The interlayer insulating layer 115 may include an inorganic material including an oxide or a nitride. For example, the interlayer insulating layer 115 may include $SiO_2$, SiNx, SiON, $Al_2O_3$, $TiO_2$, $Ta_2O_5$, $HfO_2$, or $ZnO_2$.

Referring to FIGS. 4, 9, and 10, the vertical connection wire 150 extending in the second direction is arranged on the interlayer insulating layer 115. The vertical connection wire 150 is insulated from the horizontal connection wire 140 by the interlayer insulating layer 115. The vertical connection wire 150 may include the data line 151, the driving voltage line 152, a first node connection line 153, a second node connection line 154, and an intermediate connection line 155.

The data line 151, the driving voltage line 152, the first node connection line 153, the second node connection line 154, and the intermediate connection line 155 are arranged in the same layer and may include the same material. For example, the data line 151, the driving voltage line 152, the first node connection line 153, the second node connection line 154, and the intermediate connection line 155 may include a conductive material having a high elongation property.

For example, the data line 151, the driving voltage line 152, the first node connection line 153, the second node connection line 154, and the intermediate connection line 155 may include aluminum. In an embodiment, the data line 151, the driving voltage line 152, the first node connection line 153, the second node connection line 154, and the intermediate connection line 155 may have a multi-layered structure of Ti/Al/Ti.

The data line 151 is connected to the switching source region S2 of the switching TFT T2 through a contact hole CNT7 passing through the interlayer insulating layer 115, the first organic planarization layer 161, the second gate insulating layer 113, and the first gate insulating layer 112. The data line 151 may connect the pixel circuits arranged in the second direction.

The driving voltage line 152 is connected to the operation control source region S5 of the operation control TFT T5 through a contact hole CNT8 passing through the interlayer insulating layer 115, the first organic planarization layer 161, the second gate insulating layer 113, and the first gate insulating layer 112.

In addition, the driving voltage line 152 is connected to the second electrode C2 of the storage capacitor Cst through a contact hole CNT9 passing through the interlayer insulating layer 115 and the first organic planarization layer 161. The driving voltage line 152 may connect the pixel circuits arranged in the second direction.

The first node connection line 153 transfers the initialization voltage Vint that initializes the driving TFT T1 and a pixel electrode 310 of the organic light-emitting diode OLED. The first node connection line 153 is connected to the first and second initialization TFTs T4 and T7 through a contact hole CNT11 passing through the interlayer insulating layer 115, the first organic planarization layer 161, the second gate insulating layer 113, and the first gate insulating layer 112, and is also connected to the initialization voltage line 131 through a contact hole CNT10 passing through the interlayer insulating layer 115 and the first organic planarization layer 161.

The second node connection line 154 connects the driving gate electrode G1 to the compensation drain region D3 of the compensation TFT T3 through contact holes CNT12 and CNT13. The driving gate electrode G1 that is of an island type may be electrically connected to the compensation TFT T3 by the second node connection line 154.

The intermediate connection line 155 may be connected to the second initialization source region S7 of the second initialization TFT T7 through a contact hole CNT14 passing through the interlayer insulating layer 115, the first organic planarization layer 161, the second gate insulating layer 113, and the first gate insulating layer 112. The intermediate connection line 155 may be connected to the emission control drain region D6 of the emission control TFT T6 through a contact hole CNT15 passing through the interlayer insulating layer 115, the first organic planarization layer 161, the second gate insulating layer 113, and the first gate insulating layer 112.

The data line 151, the driving voltage line 152, and the intermediate connection line 155 may connect adjacent pixels in the second direction.

A second organic planarization layer 163 is arranged on the data line 151, the driving voltage line 152, the first node connection line 153, the second node connection line 154, and the intermediate connection line 155. The second organic planarization layer 163 may include one or more selected from the group consisting of acryl, methacrylic, polyester, polyethylene, polypropylene, polyethylene terephthalate, polyethylene naphthalate, polycarbonate, polyimide, polyethylene sulfonate, polyoxymethylene, polyarylate, and hexamethyldisiloxane. The second organic planarization layer 163 may be a single layer or a multilayer.

Referring to FIG. 10, the first organic planarization layer 161 is arranged over the entire regions of the first pixel circuit PC1 and the second pixel circuit PC2 while filling the lower valley VA1 of the inorganic insulating layer between the first pixel circuit PC1 and the second pixel circuit PC2.

The first organic planarization layer 161 may include one or more selected from the group consisting of acryl, methacrylic, polyester, polyethylene, polypropylene, polyethylene terephthalate, polyethylene naphthalate, polycarbonate, polyimide, polyethylene sulfonate, polyoxymethylene, polyarylate, and hexamethyldisiloxane. In some embodiments, the first organic planarization layer 161 may include a polyimide, phenylene, or siloxane-based high heat resistant organic material. Such a material may be suitable for forming a contact hole in the first organic planarization layer 161. However, the present disclosure is not limited thereto.

The inorganic insulating layer has a higher hardness than the first organic planarization layer 161, but may be vulnerable to cracks caused by stress. The first organic planarization layer 161 may absorb the stress due to its organic material characteristics.

In the present embodiment, the inorganic insulating layer has a lower valley VA1 formed by removing a portion thereof, and the first organic planarization layer 161 fills the lower valley VA1, and thus, stress that may be applied to the display device, or a crack caused by the stress may be prevented from propagating between the first and second pixel circuits PC1 and PC2.

Since the first organic planarization layer 161 is arranged over the entire regions of the first and second pixel circuits PC1 and PC2 to provide a flat upper surface, a defect that may occur when forming the horizontal connection wire 140 on the first organic planarization layer 161 may be reduced, and a coupling that may occur between the horizontal connection wire 140 and the vertical connection wire 150 that is arranged above the horizontal connection wires 140 may be reduced.

If an upper surface of the first organic planarization layer 161 is not flat, for example, if a portion of the upper surface of the first organic planarization layer 161 is convex, the horizontal connection wire 140 may be formed to have an inconsistent width due to the non-flat surface of the first organic planarization layer 161 in the process of forming the horizontal connection wire 140 by patterning a conductive layer. In addition, if the horizontal connection wire 140 is convex along the shape of the first organic planarization layer 161, a coupling may occur between the horizontal connection wire 140 and the vertical connection wire 150 that is arranged above the horizontal connection wire 140. Therefore, it is beneficial to form the upper surface of the first organic planarization layer 161 to be flat.

The horizontal connection wire 140 is arranged on the first organic planarization layer 161. The horizontal connection wire 140 overlaps the lower valley VA1 that is arranged in a region between the first pixel circuit PC1 and the second pixel circuit PC2.

One end of the mesh connection line 142 is connected to the second electrode C2 of the storage capacitor Cst arranged in the first pixel circuit PC1 by the contact hole CNT3a passing through the first organic planarization layer 161.

The other end of the mesh connection line 142 is connected to the second electrode C2 of the storage capacitor Cst arranged in the second pixel circuit PC2 by the contact hole CNT2b passing through the first organic planarization layer 161.

The organic light-emitting diode OLED may be arranged on the second organic planarization layer 163. The organic light-emitting diode OLED includes the pixel electrode 310, an opposite electrode 330, and an intermediate layer 320 that is arranged between the pixel electrode 310 and the opposite electrode 330 and includes an emission layer.

The pixel electrode 310 is connected to the intermediate connection line 155 through a contact hole CNT16 (see FIG. 9) defined in the second organic planarization layer 163, and is connected to the emission control drain region D6 of the emission control TFT T6 by the intermediate connection line 155.

The pixel electrode 310 may be a reflective electrode including a reflective layer. For example, the reflective layer may include at least one selected from the group consisting of silver (Ag), magnesium (Mg), aluminum (Al), platinum (Pt), palladium (Pd), gold (Au), nickel (Ni), neodymium (Nd), iridium (Ir), and chrome (Cr). A transparent or translucent electrode layer that includes at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO), may be arranged on the reflective layer.

According to an embodiment, the pixel electrode 310 may include three layers of ITO/Ag/ITO.

A pixel-defining layer 117 may be arranged over the second organic planarization layer 163. The pixel-defining layer 117 defines a pixel by an opening corresponding to each sub-pixel, that is, an opening exposing a central portion of the pixel electrode 310. In addition, the pixel-defining layer 117 prevents arcs, etc. from occurring at an edge of the pixel electrode 310 by increasing a distance between edges of the pixel electrode 310 and the opposite electrode 330 over the pixel electrode 310. The pixel-defining layer 117 may include, for example, an organic material such as polyimide or hexamethyldisiloxane.

The intermediate layer 320 of the organic light-emitting diode OLED may include a material having a low molecular weight or a polymer material. In the case where the intermediate layer 320 includes a low molecular weight material, the intermediate layer 320 may have a structure in which a hole injection layer (HIL), a hole transport layer (HTL), an emission layer (EML), an electron transport layer (ETL), an electron injection layer (EIL), etc. are stacked in a single or a composite configuration, and may include various organic materials such as copper phthalocyanine (CuPc), N, N'-Di (naphthalene-1-yl)-N,N'-diphenyl-benzidine (NPB), and tris-8-hydroxyquinoline aluminum (Alq3). These layers may be formed by vacuum evaporation.

In the case where the intermediate layer 320 includes a polymer material, the intermediate layer 320 may generally have a structure including an HTL and an EML. In this case, the HTL may include PEDOT, and the EML may include a polymer material such as a polyphenylene vinylene (PPV)-based material and a polyfluorene-based material. The intermediate layer 320 may be formed by screen printing, ink-jet printing, laser induced thermal imaging (LITI), etc.

The structure of the intermediate layer 320 is not limited to the above-described structure and may have various structures. For example, the intermediate layer 320 may include a layer having a single body over a plurality of pixel electrodes 310 or may include a layer that is patterned to respectively correspond to the plurality of pixel electrodes 310.

The opposite electrode 330 is arranged over the display area DA. As illustrated in FIG. 10, the opposite electrode 330 may be arranged to cover the display area DA. That is, the opposite electrode 330 may be formed as a single body over a plurality of organic light-emitting diodes OLED to correspond to the plurality of pixel electrodes 310. The opposite electrode 330 may be a (semi) transparent electrode. For example, the opposite electrode 330 may include one or more selected from Ag, Al, Mg, Li, Ca, Cu, LiF/Ca, LiF/Al, MgAg, and CaAg, and may include a thin film having a thickness of several to several tens of nm to transmit light.

Since the organic light-emitting diode OLED may be easily damaged by external moisture or oxygen, an encapsulation layer 400 may cover and protect the organic light-emitting diode OLED. The encapsulation layer 400 may cover the display area DA and extend to outside of the display area DA. The encapsulation layer 400 may include a first inorganic encapsulation layer 410, an organic encapsulation layer 420, and a second inorganic encapsulation layer 430.

The first inorganic encapsulation layer 410 may cover the opposite electrode 330 and include ceramic, a metal oxide, a metal nitride, a metal carbide, a metal oxynitride, $In_2O_3$, $SnO_2$, ITO, a silicon oxide, a silicon nitride, and/or a silicon oxynitride. In some embodiments, other layers such as a capping layer may be arranged between the first inorganic encapsulation layer 410 and the opposite electrode 330. Since the first inorganic encapsulation layer 410 is arranged to cover the opposite electrode 330 that is not flat, an upper surface of the first inorganic encapsulation layer 410 is not planarized.

The organic encapsulation layer 420 covers the first inorganic encapsulation layer 410. Unlike the first inorganic encapsulation layer 410, an upper surface of the organic encapsulation layer 420 may be made substantially flat. Specifically, an upper surface of a portion of the organic encapsulation layer 420 corresponding to the display area DA may be made substantially flat. The organic encapsulation layer 420 may include at least one selected from the group consisting of acryl, methacrylic, polyester, polyethylene, polypropylene, polyethylene terephthalate, polyethylene naphthalate, polycarbonate, polyimide, polyethylene sulfonate, polyoxymethylene, polyarylate, and hexamethyldisiloxane.

The second inorganic encapsulation layer 430 may cover the organic encapsulation layer 420 and include ceramic, a metal oxide, a metal nitride, a metal carbide, a metal oxynitride, $In_2O_3$, $SnO_2$, ITO, a silicon oxide, a silicon nitride, and/or a silicon oxynitride.

Since the encapsulation layer 400 has a multi-layered structure including the first inorganic encapsulation layer 410, the organic encapsulation layer 420, and the second inorganic encapsulation layer 430, even though a crack occurs in the encapsulation layer 400, the encapsulation layer 400 may prevent the crack from being connected between the first inorganic encapsulation layer 410 and the organic encapsulation layer 420, or between the organic encapsulation layer 420 and the second inorganic encapsulation layer 430 through the above-described multi-layered structure. The encapsulation layer 400 may also prevent or reduce forming of a path through which external moisture or oxygen penetrates into the display area DA.

Although not shown, a spacer for preventing a damage of a mask may be further provided on the pixel-defining layer 117. In addition, various functional layers such as a polarization layer for reducing external light reflection, a black matrix, a color filter, and/or a touchscreen layer including a touch electrode may be provided on the encapsulation layer 400.

Figure 11:
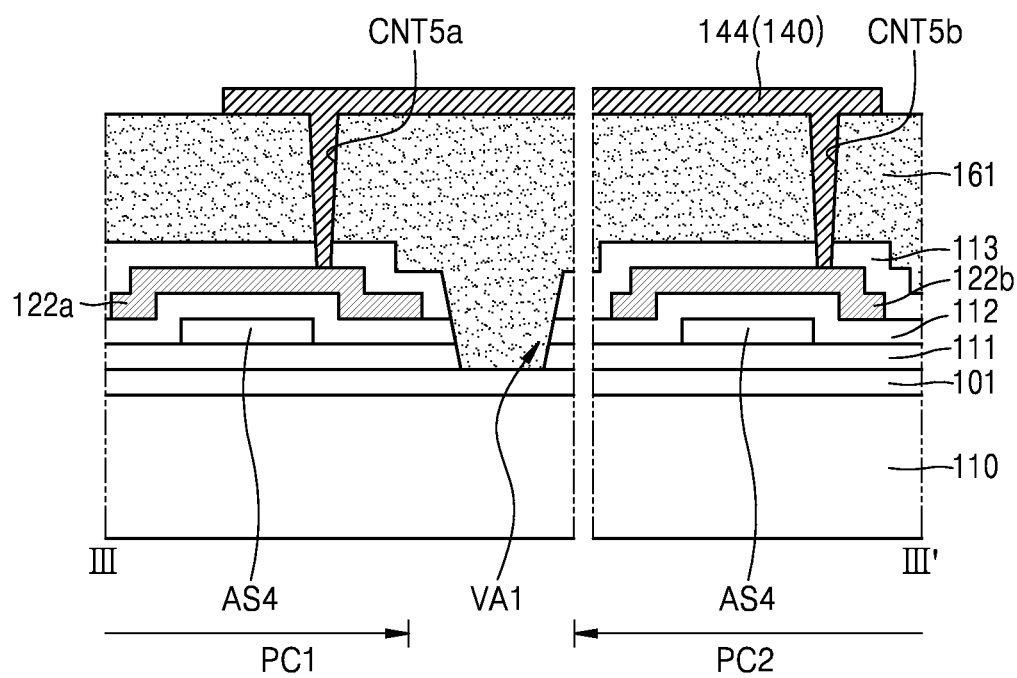
FIG. 11 is a portion of a cross-sectional view taken along line III-III' of FIG. 4.

FIG. 11 is a portion of a cross-sectional view taken along line III-III' of FIG. 4, and in FIG. 11, layers arranged on the previous scan connection line 144 are omitted.

Referring to FIG. 11, the display device according to the present embodiment includes the inorganic insulating layer having the lower valley VA1 in a region between the first pixel circuit PC1 and the second pixel circuit PC2 that are adjacent to each other, and the first organic planarization layer 161 that is arranged over the entire regions of the first pixel circuit PC1 and the second pixel circuit PC2 while filling the lower valley VA1.

The previous scan connection line 144 that is one of the horizontal connection lines 140 is arranged on the first organic planarization layer 161 and connected to the previous scan line 122a of the first pixel circuit PC1 through the contact hole CNT5*a* of the first pixel circuit PC1, and is connected to the previous scan line 122*b* of the second pixel circuit PC2 through the contact hole CNT5*b* of the second pixel circuit PC2.

The previous scan line 122*a* of the first pixel circuit PC1 and the previous scan line 122*b* of the second pixel circuit PC1 are spaced apart from each other by the lower valley VA1, but are connected to each other by the previous scan connection line 144. The previous scan lines 122*a* and 122*b* may be arranged on the first gate insulating layer 112, and the semiconductor layer AS4 of the first initialization TFT T4 (see FIG. 4) may be arranged under the first gate insulating layer 112. A portion of each of the previous scan lines 122*a* and 122*b* may function as a gate electrode of the first initialization TFT T4. The second gate insulating layer 113 may be arranged on the previous scan lines 122*a* and 122*b*.

The contact hole CNT5*a* of the first pixel circuit PC1 and the contact hole CNT5*b* of the second pixel circuit PC2 pass through the first organic planarization layer 161 and the second gate insulating layer 113, and the previous scan connection line 144 may be connected to the previous scan lines 122*a* and 122*b* through the contact holes CNT5*a* and CNT5*b*.

Figure 12:
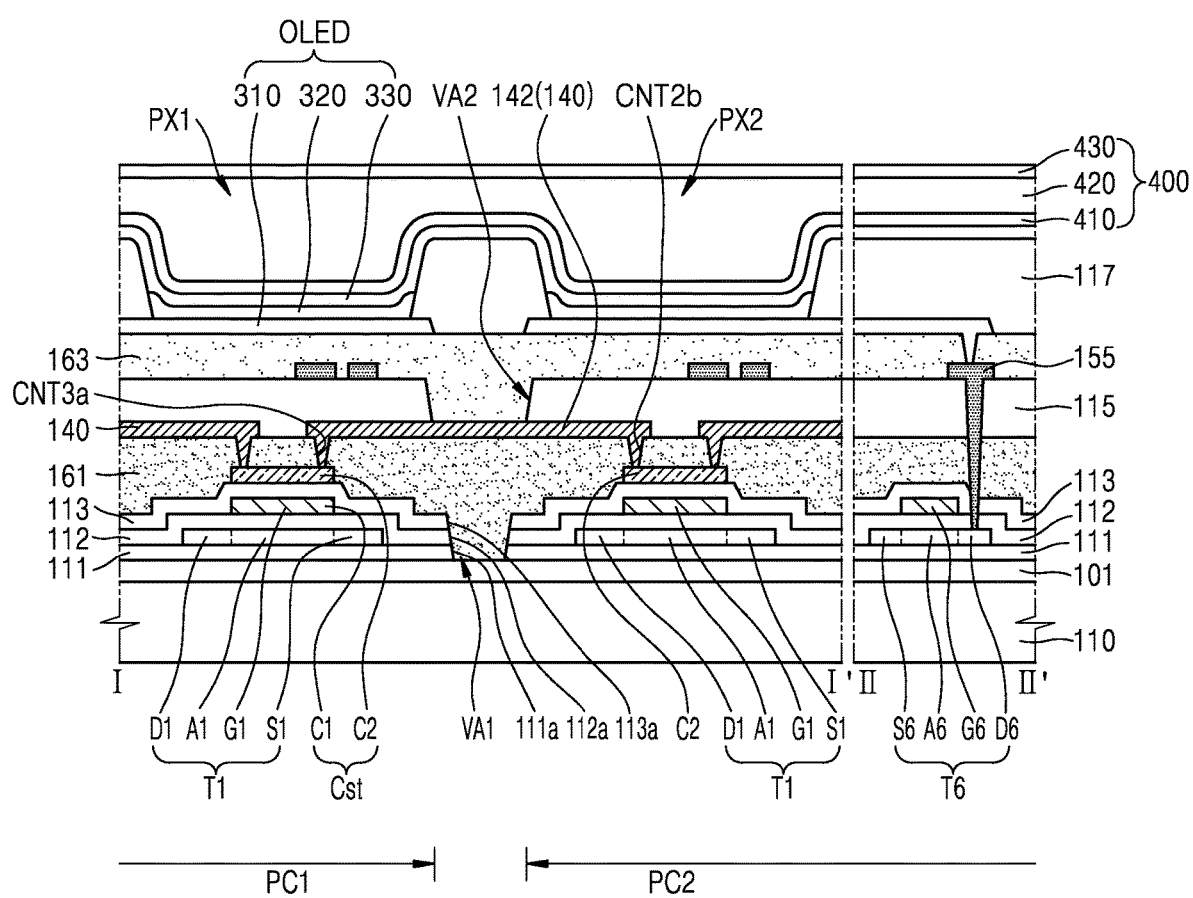
FIG. 12 is a cross-sectional view of a portion of a display device according to another embodiment.

FIG. 12 is a cross-sectional view of a portion of a display device according to another embodiment. Specifically, FIG. 12 is a cross-sectional view illustrating a location corresponding to line I-I' and II-II of FIG. 4. In FIG. 12, same reference numerals as those shown in FIG. 10 denote same elements.

Referring to FIG. 12, the display device according to the present embodiment includes an inorganic insulating layer having a lower valley VA1 in a region between a first pixel circuit PC1 and a second pixel circuit PC2 that are adjacent to each other, and a first organic planarization layer 161 that is arranged over the entire regions of the first pixel circuit PC1 and the second pixel circuit PC2 while filling the lower valley VA1.

In addition, the display device includes a horizontal connection wire 140 that is arranged on the first organic planarization layer 161 and connecting the first pixel circuit PC1 to the second pixel circuit PC2, and the horizontal connection wire 140 is connected to a second electrode C2 of the first pixel circuit PC1 through a contact hole CNT3*a* passing through the first organic planarization layer 161 and is connected to a second electrode C2 of the second pixel circuit PC2 through a contact hole CNT2*b*.

In the present embodiment, the display device includes an interlayer insulating layer 115 that is arranged on the horizontal connection wire 140, and the interlayer insulating layer 115 is provided with an upper valley VA2. The upper valley VA2 may be formed as an opening or a groove in a region between the first pixel circuit PC1 and the second pixel circuit PC2. The upper valley VA2 may be filled with a second organic planarization layer 163. Accordingly, a portion of the horizontal connection wire 140 may be arranged between the first organic planarization layer 161 and the second organic planarization layer 163.

The upper valley VA2 may overlap at least a portion of the lower valley VA1. However, the present disclosure is not limited thereto. The upper valley VA2 and the lower valley VA1 may be arranged in different regions. Various modifications may be made.

Since the upper valley VA2 is formed in the interlayer insulating layer 115, stress applied to the interlayer insulating layer 115 that is provided as an inorganic insulating layer may be prevented from propagating between the first and second pixel circuits PC1 and PC2. In addition, since the second organic planarization layer 163 is arranged in the upper valley VA2, the second organic planarization layer 163 may absorb stress applied to the display device.

Since, in a region between a plurality of pixel circuits, the first organic planarization layer 161 is arranged under the horizontal connection wire 140 and the second organic planarization layer 163 is arranged on the horizontal connection wire 140, the horizontal connection wire 140 may be resistant to damages such as cracks that may be cause by external stress.

The first organic planarization layer 161 and the second organic planarization layer 163 may include one or more selected from the group consisting of acryl, methacrylic, polyester, polyethylene, polypropylene, polyethylene terephthalate, polyethylene naphthalate, polycarbonate, polyimide, polyethylene sulfonate, polyoxymethylene, polyarylate, and hexamethyldisiloxane.

Figure 13:
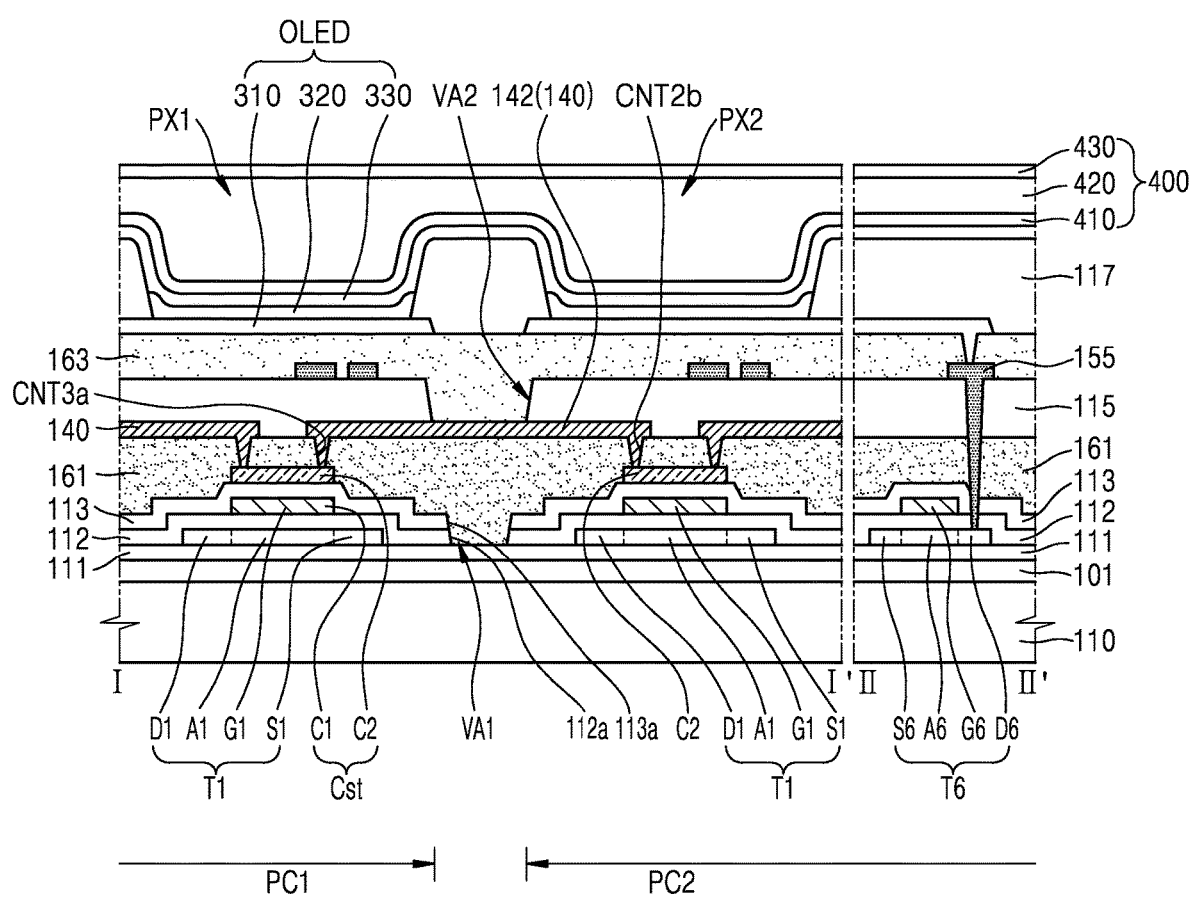
FIG. 13 is a cross-sectional view of a portion of a display device according to another embodiment.
Figure 14:
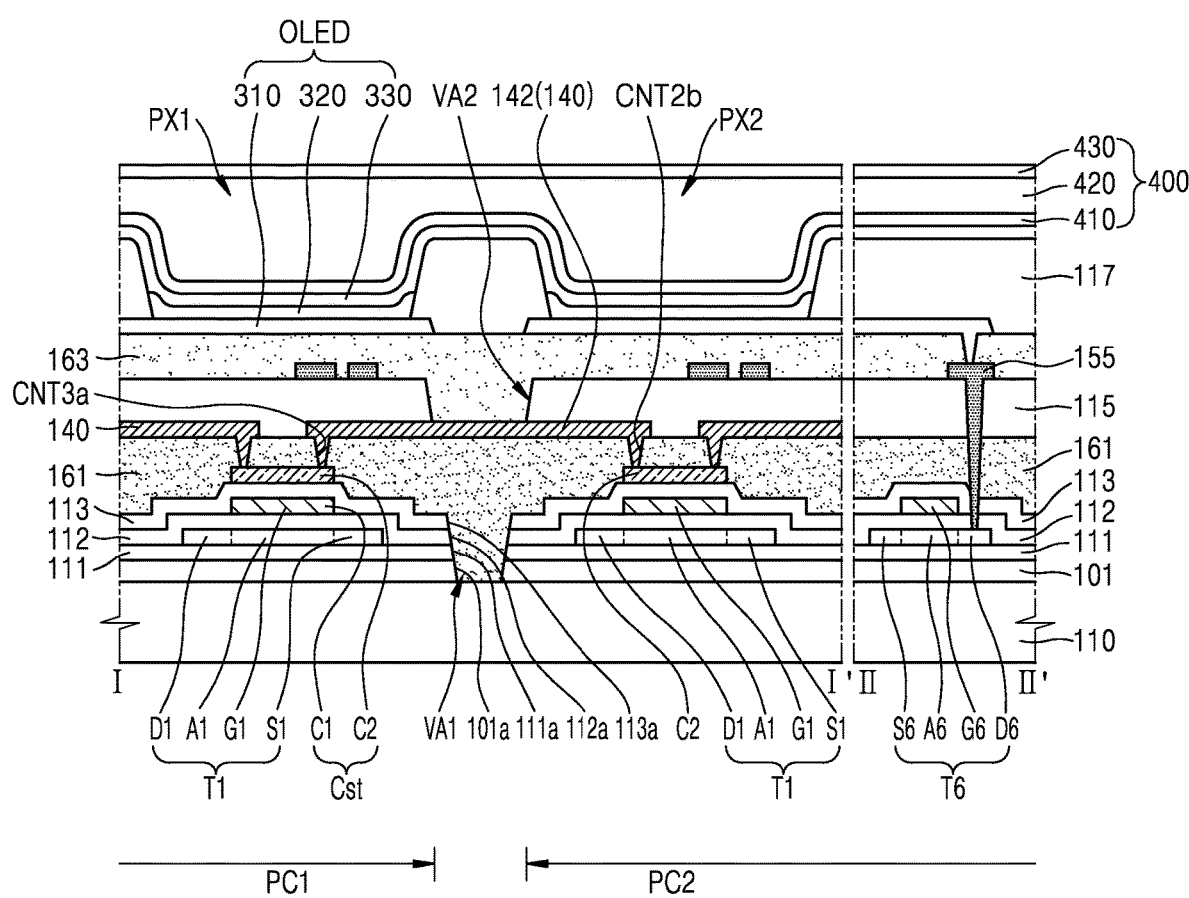
FIG. 14 is a cross-sectional view of a portion of a display device according to another embodiment.

FIGS. 13 and 14 are cross-sectional views of portions of display devices according to other embodiments. In FIGS. 13 and 14, same reference numerals as those shown in FIG. 12 denote same elements.

Referring to FIG. 13, the shape of a lower valley VA1 between a first pixel circuit PC1 and a second pixel circuit PC2 may be different from the shape of the lower valley VA1 shown in FIG. 12.

In FIG. 13, a barrier layer 101 and a buffer layer 111 in an inorganic insulating layer may be continuously arranged over a plurality of pixels. In addition, a first gate insulating layer 112 and a second gate insulating layer 113 may respectively have openings 112*a* and 113*a* in a region between adjacent pixels. Accordingly, the inorganic insulating layer including the barrier layer 101, the buffer layer 111, the first gate insulating layer 112, and the second gate insulating layer 113 may be understood as having the lower valley VA1 in a region between the first pixel circuit PC1 and the second pixel circuit PC2.

The lower valley VA1 may be formed by using separate mask process and etching process after the second gate insulating layer 113 is formed. Accordingly, the shape of the lower valley VA1 of the inorganic insulating layer may be selected.

A structure shown in FIG. 13 may be formed by an etching process of forming the openings 112*a* and 113*a* respectively of the first gate insulating layer 112 and the second gate insulating layer 113.

The shape of the lower valley VA1 of the inorganic insulating layer may be varied. For example, the barrier layer 101, the buffer layer 111, and the first gate insulating layer 112 may be continuously formed over the first pixel circuit PC1 and the second pixel circuit PC2, only the second gate insulating layer 113 may have the opening 113*a*, or only a portion of the second gate insulating layer 113 may be removed. Various modifications may be made.

The first organic planarization layer 161 may fill the lower valley VA1, and the horizontal connection wire 140 connecting adjacent pixels may be arranged on the first organic planarization layer 161.

Referring to FIG. 14, the inorganic insulating layer may include the lower valley VA1 that is formed by forming an opening in a region between a plurality of pixel circuits, that is, the first pixel circuit PC1 and the second pixel circuit PC2. That is, the barrier layer 101, the buffer layer 111, the first gate insulating layer 112, and the second gate insulating layer 113 in the inorganic insulating layer may respectively have openings 101a, 111a, 112a, and 113a in a region between the first pixel circuit PC1 and the second pixel circuit PC2.

A width of each of the openings may be several μm. The openings may be formed by performing separate mask processes and dry etching after the second gate insulating layer 113 is formed. Accordingly, the lower valley VA1 of the inorganic insulating layer may have a shape of an opening or groove.

The first organic planarization layer 161 fills the openings, and the horizontal connection wire 140 connecting adjacent pixels may be arranged on the first organic planarization layer 161.

Figure 15:
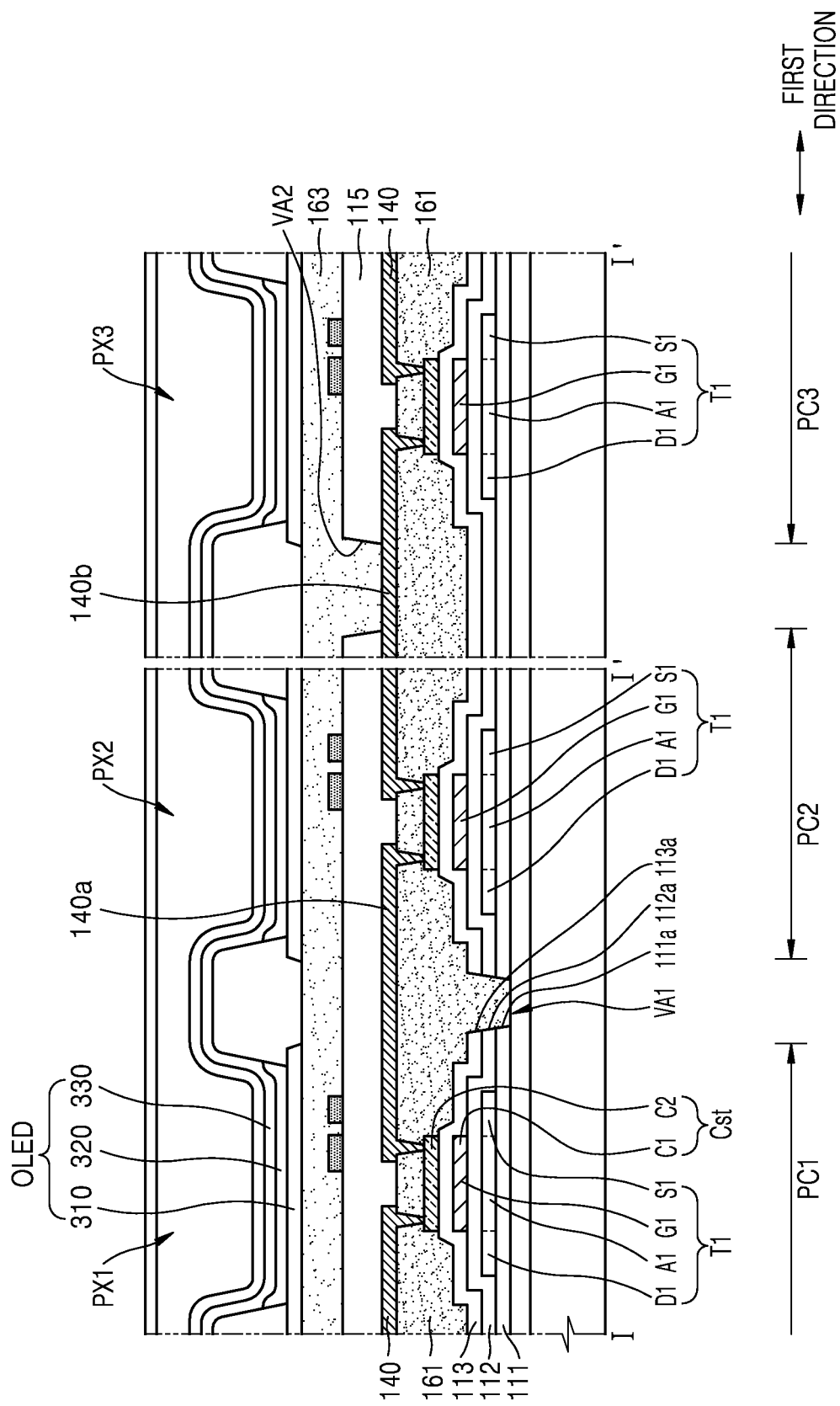
FIG. 15 is a cross-sectional view of a portion of a display device according to another embodiment.

FIG. 15 is a cross-sectional view of a portion of a display device according to another embodiment. In FIG. 15, same reference numerals as those shown in FIG. 12 denote same elements.

Referring to FIG. 15, the display device includes a first pixel circuit PC1, a second pixel circuit PC2, and a third pixel circuit PC3 that are sequentially arranged in a first direction.

In the present embodiment, the display device includes an inorganic insulating layer having a lower valley VA1 in a region between the first pixel circuit PC1 and the second pixel circuit PC2 that are adjacent to each other, and a first organic planarization layer 161 arranged over the entire regions of the first pixel circuit PC1 and the second pixel circuit PC2.

The display device includes a first connection wire 140a that is arranged on the first organic planarization layer 161 and connecting the first pixel circuit PC1 to the second pixel circuit PC2.

An interlayer insulating layer 115 having an upper valley VA2 is provided in a region between the second pixel circuit PC2 and the third pixel circuit PC3, and the upper valley VA2 is filled with a second organic planarization layer 163. A second connection wire 140b is arranged under the interlayer insulating layer 115 and partially overlaps the upper valley VA2 and connects the second pixel circuit PC2 to the third pixel circuit PC3.

In the present embodiment, the lower valley VA1 and the upper valley VA2 may not overlap each other in the entire area or a portion of the area of the display device. The flexibility of the display device may be obtained by the provision of the lower valley VA1 and the upper valley VA2, but the relative stiffness of the display device may be lowered. When the lower valley VA1 and the upper valley VA2 may be arranged in a non-overlapping manner in at least some of regions between a plurality of pixel circuits as shown in FIG. 15, thereby obtaining the desired flexibility and stiffness of the display device.

In some embodiments, the lower valley VA1 and the upper valley VA2 may be arranged in a crossing manner in regions between a plurality of pixel circuits in one direction.

Figure 16:
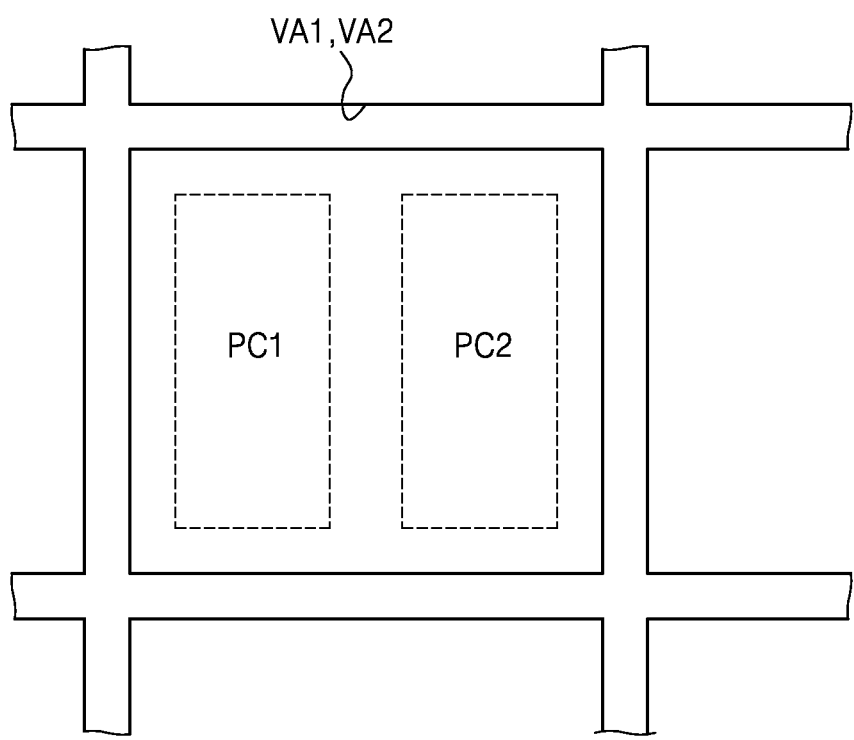
FIG. 16 is a plan view of a portion of a display device according to another embodiment.
Figure 17:
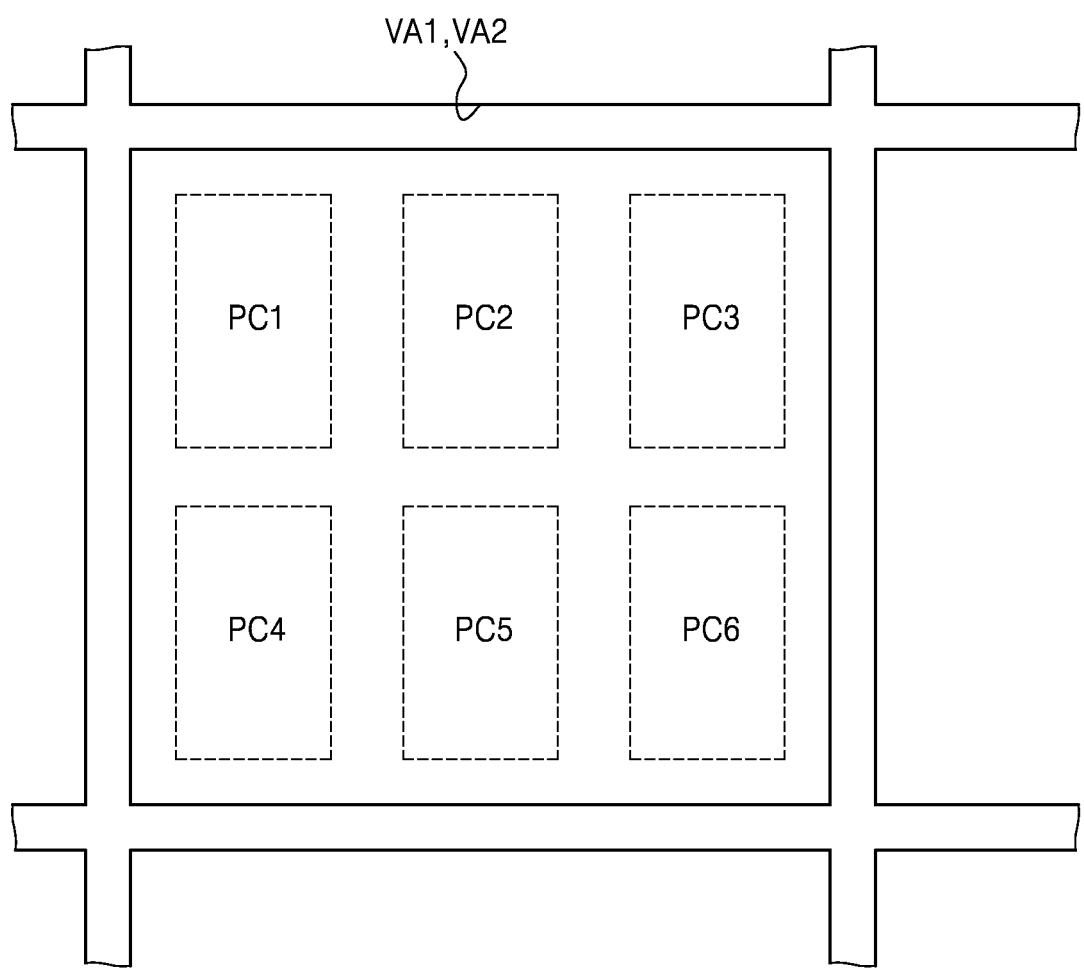
FIG. 17 is a plan view of a portion of a display device according to another embodiment.

FIGS. 16 and 17 are plan views of portions of display devices according to other embodiments.

Referring to FIGS. 16 and 17, a lower valley VA1 of an inorganic insulating layer or an upper valley VA2 of an interlayer insulating layer may group a plurality of pixels and surround the grouped pixels. In FIG. 16, the lower valley VA1 and/or the upper valley VA2 surround two pixel circuits, that is, a first pixel circuit PC1 and a second pixel circuit PC2. In FIG. 17, a lower valley VA1 of an inorganic insulating layer and/or an upper valley VA2 of an interlayer insulating layer surrounds six pixel circuit PC1 to PC6. The number of grouped pixel circuits may be modified variously.

The number of grouped pixels may be the same or may differ depending on a location in the display device. For example, in a region that is susceptible to a crack or stress, the lower valley VA1 of the inorganic insulating layer and/or the upper valley VA2 of the interlayer insulating layer may surround one pixel. In other regions, the lower valley VA1 of the inorganic insulating layer and/or the upper valley VA2 of the interlayer insulating layer may surround a plurality of pixels. Alternatively, the lower valley VA1 of the inorganic insulating layer and/or the upper valley VA2 of the interlayer insulating layer may be formed in only a portion of the display area DA.

Figure 18:
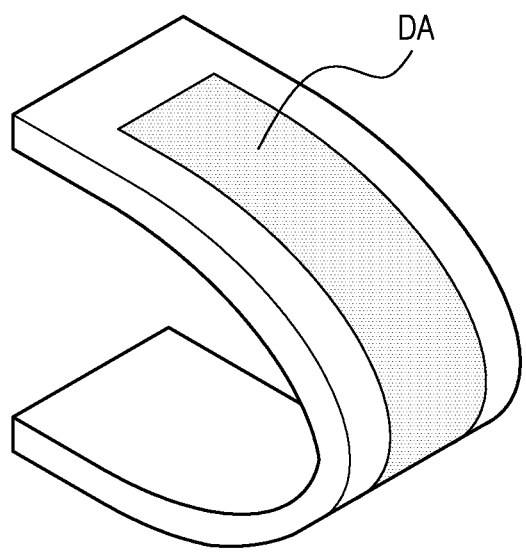
FIG. 18 is a view of a display device according to an embodiment.
Figure 19:
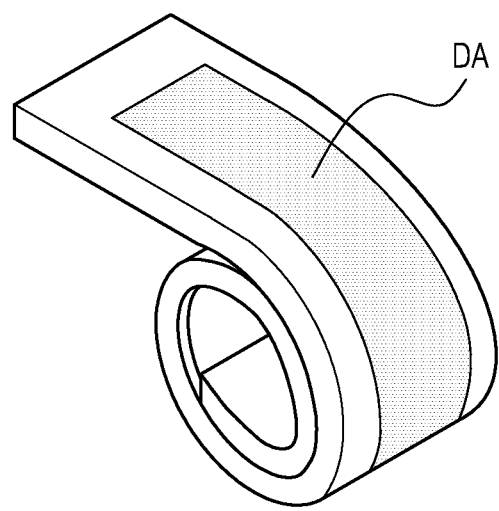
FIG. 19 is a view of a display device according to an embodiment.

FIGS. 18 and 19 are views of a display device according to an embodiment. FIG. 18 illustrates that a display area of the display device is folded, and FIG. 19 illustrates that a display area of the display device is rolled.

Since the display device according to an embodiment includes the lower valley VA1 of the inorganic insulating layer and the first organic planarization layer 161 filling the lower valley VA1 in a display area DA, the display area DA is foldable or rollable, as illustrated in FIGS. 18 and 19.

That is, even when the display area DA is folded or rolled, since the display device includes the lower valley VA1 in the inorganic insulating layer, occurrence of a crack may be prevented or reduced because the first organic planarization layer 161 filling the lower valley VA1 may absorb stress caused by bending.

Figure 20:
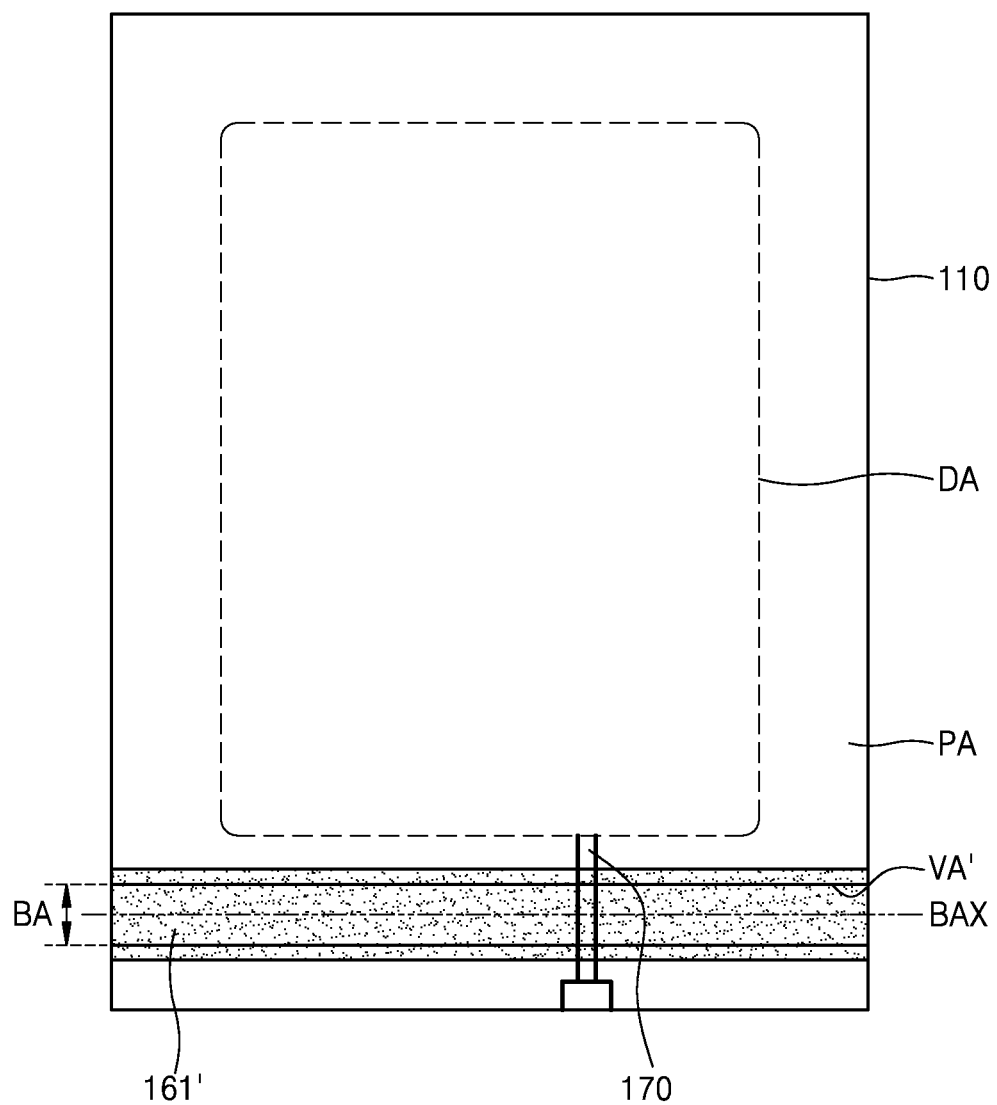
FIG. 20 is a plan view of a display device according to another embodiment.

FIG. 20 is a plan view of a display device according to another embodiment. Referring to FIG. 20, the display device according to an embodiment includes a bending area BA in a peripheral area PA, and the bending area BA is bent around a bending axis BAX. The display device may further include a bending valley VA' and a bending organic material layer 161' that fills the bending valley VA' in the bending area BA. In addition, the display device may further include a fan-out wire 170 that is arranged on the bending organic material layer 161', extending from a display area DA, and crossing the bending area BA.

The bending valley VA' may denote an opening or a groove formed in a portion of the inorganic insulating layer corresponding to the bending area BA. The bending valley VA' may be simultaneously formed when the lower valley VA1 (see FIG. 10) is formed in the inorganic insulating layer in the display area DA.

The bending organic material layer 161' may fill the bending valley VA' and absorb stress applied while the display device is bent. The bending organic material layer 161' may be formed simultaneously with a first organic planarization layer (e.g., the first organic planarization layer 161 described above) in the display area DA and may include the same material as that of the first organic planarization layer 161.

The fan-out wire 170 may denote a wire arranged in the peripheral area PA and transferring electric signals to the display area DA, and the electric signals are provided from a driving driver integrated circuit (IC) that is arranged in the peripheral area PA or a flexible printed circuit board (not shown).

The fan-out wire 170 may be formed simultaneously with a horizontal connection wire (e.g., the horizontal connection wire 140 described above) or a vertical connection wire (e.g., the vertical connection wire 150 described above) in the display area DA and may include the same material as that of the horizontal connection wire or the vertical connection wire. That is, the fan-out wire 170 may include a material having a high elongation property. For example, the fan-out wire 170 may include aluminum. The fan-out wire 170 may have a multi-layered structure in some embodiments. In an embodiment, the fan-out wire 170 has a stacked structure of Ti/Al/Ti.

The display device according to an embodiment may be made to be folded or rolled in the entire area of the display device or a selected portion or portions of the display area DA and/or the peripheral area PA.

Although the disclosure has been described with reference to the embodiments illustrated in the drawings, this is merely provided as an example and it will be understood by those of ordinary skill in the art that various changes in form and details and equivalents thereof may be made therein without departing from the spirit and scope of the disclosure as defined by the following claims.

As described above, the display device according to embodiments includes an inorganic insulating layer having a lower valley, and an organic planarization layer filling the lower valley, and thus, the display device may be flexible while being resistant to damages cause by an external impact.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. A display device comprising:
    a substrate comprising a display area and a peripheral area outside the display area, the display area comprising a plurality of pixel circuits and a plurality of display elements respectively connected to the plurality of pixel circuits to display an image;
    an inorganic insulating layer arranged in the display area, the inorganic insulating layer having a lower valley as an opening or a groove in a region and arranged between a first pixel circuit and a second pixel circuit that are adjacent to each other;
    a first organic planarization layer arranged over entire regions of the first pixel circuit and the second pixel circuit, the first organic planarization layer filling the lower valley; and
    a connection wire arranged on the first organic planarization layer, the connection wire connecting the first pixel circuit to the second pixel circuit,
    wherein the connection wire is connected to a first conductive layer in the first pixel circuit through a first contact hole passing through the first organic planarization layer and is connected to a second conductive layer in the second pixel circuit through a second contact hole passing through the first organic planarization layer, and
    wherein the lower valley surrounds at least one pixel circuit or some pixel circuits from among the plurality of pixel circuits.

2. The display device of claim 1, wherein the first conductive layer and the second conductive layer are spaced apart from each other by the lower valley, and the first conductive layer and the second conductive layer are arranged on an upper surface of the inorganic insulating layer.

3. The display device of claim 1, wherein the inorganic insulating layer comprises a first gate insulating layer and a second gate insulating layer arranged on the first gate insulating layer,
    wherein the first conductive layer and the second conductive layer are arranged on the first gate insulating layer and are spaced apart from each other by the lower valley, the second gate insulating layer covers the first conductive layer and the second conductive layer, and the first contact hole and the second contact hole pass through the second gate insulating layer.

4. The display device of claim 1, further comprising an interlayer insulating layer arranged on the connection wire, the interlayer insulating layer having an upper valley as an opening or a groove arranged in a region between the first pixel circuit and the second pixel circuit.

5. The display device of claim 4, further comprising a second organic planarization layer arranged over the entire regions of the first pixel circuit and the second pixel circuit, the second organic planarization layer filling the upper valley.

6. The display device of claim 1, wherein the plurality of pixel circuits comprise a third pixel circuit adjacent to the second pixel circuit, the display device further comprising:
    an additional connection wire arranged on a same layer as the connection wire, the additional connection wire connecting the second pixel circuit to the third pixel circuit; and
    an interlayer insulating layer arranged on the additional connection wire, the interlayer insulating layer having an upper valley in a region between the second pixel circuit and the third pixel circuit.

7. The display device of claim 6, wherein the additional connection wire is formed integrally with the connection wire.

8. The display device of claim 1, wherein each of the plurality of pixel circuits comprises a driving thin film transistor and a storage capacitor,
    wherein the driving thin film transistor overlaps the storage capacitor.

9. The display device of claim 1, further comprising:
    a bending organic material layer arranged in a bending area bent around a bending axis extending in a first direction in the peripheral region; and
    a fan-out wire extending in a second direction crossing the first direction and arranged on the bending organic material layer.

10. A display device comprising a first pixel circuit, a second pixel circuit, and a third pixel circuit, sequentially arranged in a first direction, in a display area for displaying an image, the display device comprising:
    an inorganic insulating layer having a first lower valley as an opening or a groove and arranged in a first region between the first pixel circuit and the second pixel circuit;
    a first organic planarization layer arranged over entire regions of the first pixel circuit, the second pixel circuit, and the third pixel circuit, the first organic planarization layer filling the first lower valley;
    a first connection wire arranged on the first organic planarization layer, the first connection wire overlapping the first region and connecting the first pixel circuit and the second pixel circuit;
    a second connection wire arranged on the first organic planarization layer, the second connection wire connecting the second pixel circuit and the third pixel circuit;

an interlayer insulating layer arranged on the first connection wire and the second connection wire, the interlayer insulating layer having a second upper valley as an opening or a groove and arranged in a second region between the second pixel circuit and the third pixel circuit; and a second organic planarization layer arranged over the entire regions of the first pixel circuit, the second pixel circuit, and the third pixel circuit, the second organic planarization layer filling the second upper valley.

11. The display device of claim 10, wherein the interlayer insulating layer further has a first upper valley as an opening or a groove that is arranged in the first region.

12. The display device of claim 10, wherein the inorganic insulating layer further has a second lower valley as an opening or a groove that is arranged in the second region.

13. The display device of claim 10, further comprising a vertical connection wire arranged on the interlayer insulating layer and extending in a second direction crossing the first direction.

14. The display device of claim 13, wherein the vertical connection wire comprises a driving voltage line and a data line.

15. The display device of claim 10, wherein the inorganic insulating layer comprises a first gate insulating layer and a second gate insulating layer arranged on the first gate insulating layer, the display device further comprising:

a first conductive layer arranged on the first gate insulating layer in the first pixel circuit; and a second conductive layer arranged on the first gate insulating layer in the second pixel circuit, wherein the first conductive layer and the second conductive layer are spaced apart from each other by the first lower valley, and the first connection wire is connected to the first conductive layer and the second conductive layer respectively through a first contact hole and a second contact hole passing through the first organic planarization layer and the second gate insulating layer.

16. The display device of claim 10, wherein at least one of the first lower valley and the second upper valley surrounds at least some of the first to third pixel circuits.

17. The display device of claim 10, wherein each of the first pixel circuit and the second pixel circuit comprises a driving thin film transistor and a storage capacitor that overlap each other, wherein an upper electrode of the storage capacitor of the first pixel circuit and an upper electrode of the storage capacitor of the second pixel circuit are connected by a mesh connection line that is one of the first connection wire.

18. The display device of claim 10, wherein each of the first pixel circuit, the second pixel circuit, and the third pixel circuit comprises:

an organic light-emitting element including a pixel electrode, an opposite electrode facing the pixel electrode, and an intermediate layer including an organic light-emitting layer arranged between the pixel electrode and the opposite electrode; and an encapsulation layer covering the organic light-emitting element, wherein the encapsulation layer comprises a first inorganic encapsulation layer, a second inorganic encapsulation layer, and an organic encapsulation layer arranged between the first inorganic encapsulation layer and the second inorganic encapsulation layer.

19. The display device of claim 10, wherein at least a portion of the display area of the display device is folded or rolled.

* * * * *